United States Patent
Masuoka et al.

(10) Patent No.: US 7,940,574 B2
(45) Date of Patent: May 10, 2011

(54) NONVOLATILE SEMICONDUCTOR MEMORY AND METHOD OF DRIVING THE SAME

(75) Inventors: Fujio Masuoka, Chuo-ku (JP); Hiroki Nakamura, Chuo-ku (JP)

(73) Assignees: Unisantis Electronics, Tokyo (JP); Tohoku University, Miyagi (JP)

( * ) Notice: Subject to any disclaimer, the term of this patent is extended or adjusted under 35 U.S.C. 154(b) by 153 days.

(21) Appl. No.: 12/319,782

(22) Filed: Jan. 12, 2009

(65) Prior Publication Data

US 2009/0129171 A1 May 21, 2009

Related U.S. Application Data

(63) Continuation of application No. PCT/JP2007/063889, filed on Jul. 12, 2007.

(30) Foreign Application Priority Data

Jul. 12, 2006 (JP) .................. 2006-191470

(51) Int. Cl.
 *G11C 16/04* (2006.01)
(52) U.S. Cl. ......... 365/185.29; 365/185.21; 365/185.18; 365/185.03
(58) Field of Classification Search ............. 365/185.29, 365/185.21, 185.18, 185.03
See application file for complete search history.

(56) References Cited

U.S. PATENT DOCUMENTS 5,616,510 A 4/1997 Wong
(Continued)

FOREIGN PATENT DOCUMENTS

JP 4-302477 A 10/1992
(Continued)

OTHER PUBLICATIONS

International Search Report issued Sep. 18, 2007 in International application No. PCT/JP2007/063889 3 pages.
(Continued)

*Primary Examiner* — Connie C Yoha
(74) *Attorney, Agent, or Firm* — Brinks Hofer Gilson & Lione

(57) ABSTRACT

It is an object of the present invention to provide a nonvolatile semiconductor memory including memory cells using side walls of island semiconductor layers which avoid lowing of the writing speed and the reading speed. In the nonvolatile semiconductor memory having the nonvolatile semiconductor memory cells each having an island semiconductor layer formed on a semiconductor substrate, the island semiconductor layer having a drain diffusing layer formed on top thereof, a source diffusion layer formed on the lower side thereof, a charge-storage layer formed on a channel area on the side wall interposed between the drain diffusion layer and the source diffusion layer via a gate insulation film, and a control gate formed on the charge-storage layer arranged in matrix, bit lines connected to the drain diffusion layers are arranged in the column direction, control gate lines are arranged in the row direction, and source lines connected to the source diffusion layers are arranged in the column direction, the above-described object is achieved by the nonvolatile semiconductor memory characterized in that common source lines connected to the source lines are formed at every predetermined number of control gate lines, the common source lines are formed of metal, and the common source lines are arranged in the row direction.

10 Claims, 40 Drawing Sheets

U.S. PATENT DOCUMENTS

| | | | |
|---|---|---|---|
| 5,654,920 A * | 8/1997 | Watsuji et al. | 365/185.27 |
| 6,108,239 A | 8/2000 | Sekariapuram et al. | |
| 6,240,016 B1 * | 5/2001 | Haddad et al. | 365/185.18 |
| 6,493,265 B2 * | 12/2002 | Satoh et al. | 365/185.21 |
| 7,259,992 B2 * | 8/2007 | Shirota | 365/185.21 |
| 2001/0039091 A1 | 11/2001 | Nakagawa | |
| 2004/0026748 A1 | 2/2004 | Goda et al. | |
| 2005/0152187 A1 | 7/2005 | Fujiwara et al. | |
| 2009/0251949 A1 * | 10/2009 | Xia | 365/158 |

FOREIGN PATENT DOCUMENTS

| | | |
|---|---|---|
| JP | 6-296025 A | 10/1994 |
| JP | 8-148587 A | 6/1996 |
| JP | 9-259591 A | 10/1997 |
| JP | 10-209407 A | 8/1998 |
| JP | 2001-223284 A | 8/2001 |
| JP | 2003-86714 A | 3/2003 |
| JP | 2005-12137 A | 1/2005 |
| JP | 2005-268418 A | 9/2005 |

OTHER PUBLICATIONS

Ohba, et al. "A novel tri-control gate surrounding gate transistor (TCG-SGT) nonvolatile memory cell for flash memory", Solid-State Electronics, vol. 50 (2006), pp. 924-928.

Howard Pein, et.al, "A 3-D Sidewall Flash EPROM Cell and Memory Array", IEEE Electron Device Letters, vol. 14, No. 8, pp. 415-417, 1993.

Extended European Search Report for European Application No. 07790683.2, dated Oct. 13, 2010, 22 pages.

Non-Final Office Action—Apln. U.S. Appl. No. 12/319,770, dated Sep. 2, 2010 (11 pages).

Amendment and Response Under 37 C.F.R. § 1.111, filed with the USPTO Dec. 1, 2010—(11 pages).

* cited by examiner

# NONVOLATILE SEMICONDUCTOR MEMORY AND METHOD OF DRIVING THE SAME

RELATED APPLICATIONS

This application is a continuation of PCT/JP2007/063889, filed on Jul. 12, 2007, which claims priority to Japanese Application No. JP2006-191470, filed on Jul. 12, 2006. The entire contents of these applications are incorporated herein by reference.

TECHNICAL FIELD

The present invention relates to a nonvolatile semiconductor memory and a method of driving the same.

BACKGROUND ART

A flash memory including a memory cell which is able to secure a sufficiently large amount of capacity between a charge-storage layer and a control gate in a small occupancy area on a substrate, achieving a superior writing and deleting efficiency, and having the charge-storage layer and the control gate formed on a side wall of an island semiconductor layer formed on the surface of a semiconductor substrate so as to surround the island semiconductor layer is proposed (for example, see JP-A-8-148587 and Howard Pein, et. al, IEEE Electron Device Letters, Vol. 14, No. 8, pp. 415-pp. 417, 1993).

In the flash memory described above, injection of electric charge to the charge-storage layer is carried out using hot electrons. The differences of threshold voltages according to the difference of the charge storage state of the charge-storage layer are stored as data "0", "1". For example, in the case of an N-channel memory cell using a floating gate for the charge-storage layer, a high voltage is applied to the control gate and a drain diffusion layer, and a source diffusion layer and the semiconductor substrate are grounded when injecting electric charge to the floating gate. At this time, the electric charge is injected by enhancing electronic energy of the semiconductor substrate by the voltage between a source and a drain to allow the electric charge to surmount an energy barrier of a tunnel oxide film and to be injected to the electric-storage layer. As a result of the injection of the electric charge, a threshold voltage of the memory cell moves in the normal direction. The percentage of a current flowing between the source and the drain which is injected into the charge-storage layer is low. Therefore, the current required for writing is on the order of 100 μA per cell. In the case of NOR type flash memories, a current flowing during reading is on the order of 30 μA.

A flash memory cell array including the memory cell using the side wall of the island semiconductor layer employs a diffusion layer as a source line or a source surface. The diffusion layer has higher resistance than metal. When a current flows in the resistance, a potential difference is generated. Therefore, at the time of writing, the voltage of the source diffusion layer of the memory cell assumes a voltage higher than 0V, the voltage between the source and the drain is lowered, the current flowing between the source and drain is reduced, and the writing speed is lowered. At the time of reading as well, the voltage of the source diffusion layer of the memory cell assumes a voltage higher than 0V, the voltage between the source and the drain is lowered, a current flowing between the source and drain is reduced, and the reading speed is lowered.

SUMMARY OF THE INVENTION

Accordingly, an object is to provide a nonvolatile semiconductor memory including a memory cell which utilizes a side wall of an island semiconductor layer for avoiding lowering of the writing speed and the reading speed.

In order to achieve the object described above, the present invention has a following configuration. According to a characteristic of the present invention, there is provided a nonvolatile semiconductor memory including memory cells each having a charge-storage layer formed with a source area, a channel area, and a drain area thereon in this order from a substrate side, and further having a charge-storage layer formed on the outside of the channel area via a gate insulating film, and a control gate formed on the outside of the charge-storage layer so as to cover the charge-storage layer via an insulating layer, the memory cells arranged in matrix of n rows and m columns on the substrate including:

a plurality of first source lines arranged in the column direction so as to connect source areas of the memory cells arranged in the column direction of the matrix with respect to each other;

a plurality of parallel bit lines arranged in the column direction so as to connect the drain areas arranged in the column direction on a layer different from the first source lines with respect to each other;

lines arranged in the row direction so as to connect the control gates of the memory cells arranged in the row direction which is substantially orthogonal to the column direction with respect to each other being employed as gate lines; and second source lines arranged one each at every p rows (p<n) of the matrix and formed of metal for connecting the first source lines with respect to each other.

According to another characteristic of the present invention, there is provided a nonvolatile semiconductor memory including memory cells each having a charge-storage layer formed with a source area, a channel area, and a drain area thereon in this order from a substrate side, and further having a charge-storage layer formed on the outside of the channel area via a gate insulating film, and a control gate formed on the outside of the charge-storage layer so as to cover the charge-storage layer via an insulating layer, the memory cells being arranged in a matrix of n rows and m columns on the substrate including:

a plurality of parallel bit lines arranged in the column direction so as to connect the drain areas of the memory cells arranged in the column direction on a layer different from a layer of the source line with respect to each other;

a plurality of gate lines arranged in the row direction so as to connect the control gates of the memory cells arranged in the row direction which is substantially orthogonal to the column direction with respect to each other; and common source line one of which is arranged at each p row (p<n) of the matrix and formed of metal for connecting the source lines with respect to each other.

According to still another characteristic of the present invention, there is provided a nonvolatile semiconductor memory including memory cells each having a charge-storage layer formed with a source area, a channel area, and a drain area thereon in this order from a substrate side, and further having a charge-storage layer formed on the outside of the channel area via a gate insulating film, and a control gate formed on the outside of the charge-storage layer so as to cover the charge-storage layer via an insulating layer, the memory cells arranged in matrix of n rows and m columns on the substrate including:

a first common diffusion source line arranged so as to connect source areas of the memory cells arranged respectively in the row and column directions of the matrix with respect to each other;

a plurality of parallel bit lines arranged in the column direction so as to connect the drain areas of the memory cells arranged in the column direction on a layer different from the first common diffusion source line with respect to each other;

lines arranged in the row direction so as to connect the control gates of the memory cells arranged in the row direction which is substantially orthogonal to the column direction with respect to each other being employed as gate lines; and second source lines formed of metal to be connected to the first common diffusion source line and arranged one each at every p rows (p<n) of the matrix.

According to a characteristic of a method of driving a nonvolatile semiconductor memory of the present invention, there is provided a method of writing to a nonvolatile semiconductor memory by injecting the electric charge to the charge-storage layer of a selected memory cell using hot electron including: applying a first voltage of 0V or a positive value to a selected bit line and applying a voltage of 0V to non-selected bit lines; applying a second voltage of a positive value to a selected gate line; applying a voltage of 0V to non-selected gate lines; and applying a voltage of 0V to a first source line or a first common diffusion source line and second source lines.

According to another characteristic of a method of driving a non-volatile semiconductor memory according to the present invention, there is provided a method of reading from a nonvolatile semiconductor memory by reading a selected memory cell including: applying a first voltage of a positive value to a selected gate line; applying a voltage of 0V to non-selected gate lines; applying a voltage of 0V to first source lines or a first common diffusion source line and second source lines; and applying a second voltage of a positive value to a selected bit line.

According to still another method of driving a non-volatile semiconductor memory of the present invention, there is provided a method of deleting a nonvolatile semiconductor memory by discharging an electric charge from a charge-storage layer of all memory cells using FN tunnel current including: applying a first voltage of a positive value to bit lines and first source lines or a first common diffusion source line and second source lines; and applying a voltage of 0V to gate lines.

According to still another method of driving a non-volatile semiconductor memory of the present invention, there is provided a method of deleting a nonvolatile semiconductor memory by discharging an electric charge from a charge-storage layer of a memory cell connected to a selected gate line using FN tunnel current including: applying a first voltage of a positive value to bit lines and first source lines or a first common diffusion source line and second source lines; applying a voltage of 0V to the selected gate line; and applying a second voltage of a positive value to non-selected gate lines.

According to the present invention, since the second source lines formed of metal are provided at every predetermined number of gate lines, reduction of the resistance of the source lines is achieved, whereby at the time of writing, application of a voltage of 0V to the source diffusion layers of the memory cells is achieved, application of a sufficient voltage between the source and the drain is achieved, and flowing of a sufficient current between the source and the drain is achieved, so that lowering of the writing speed can be avoided. At the time of reading as well, application of a voltage of 0V to the source diffusion layers of the memory cells is achieved, application of a sufficient voltage between the source and the drain is achieved, and flowing of a sufficient current between the source and the drain is achieved, so that lowering of the reading speed is avoided.

DETAILED DESCRIPTION OF THE PREFERRED EMBODIMENTS

Figure 1:
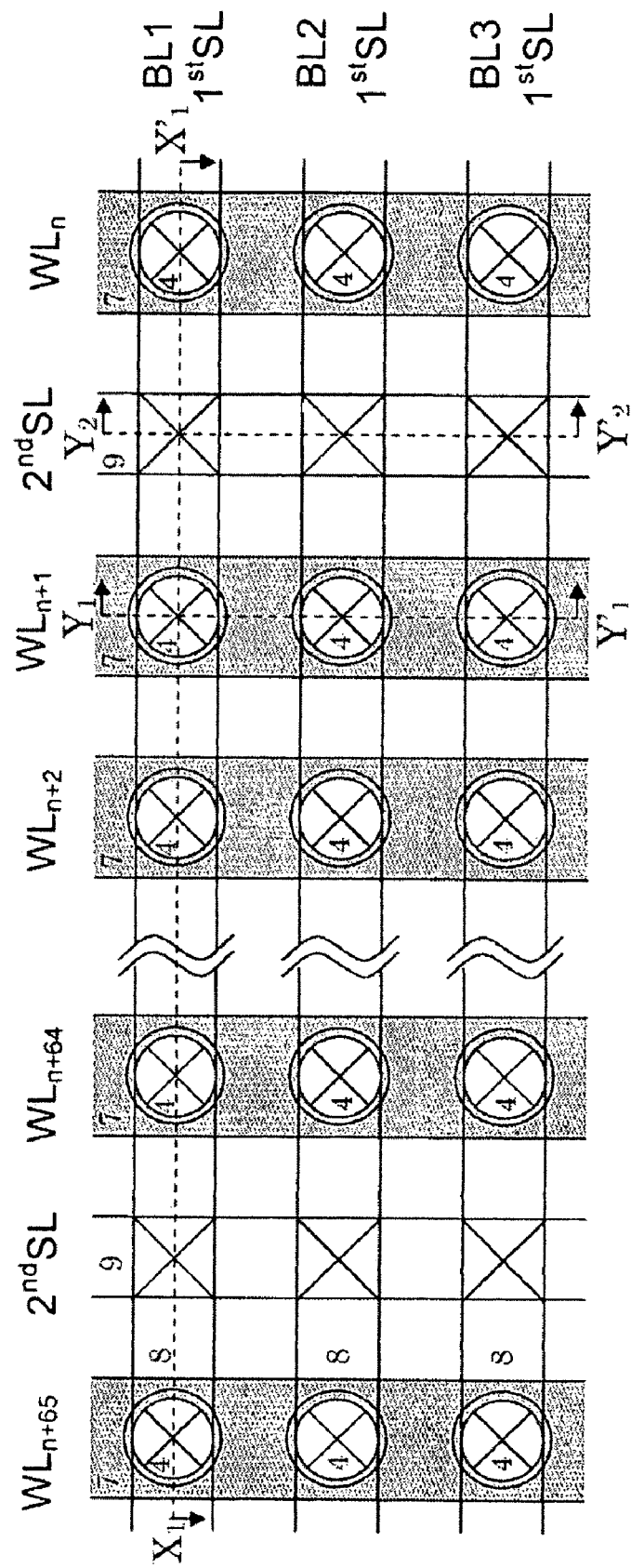
FIG. 1 is a layout of a non-volatile semiconductor memory according to the present invention.
Figure 2:
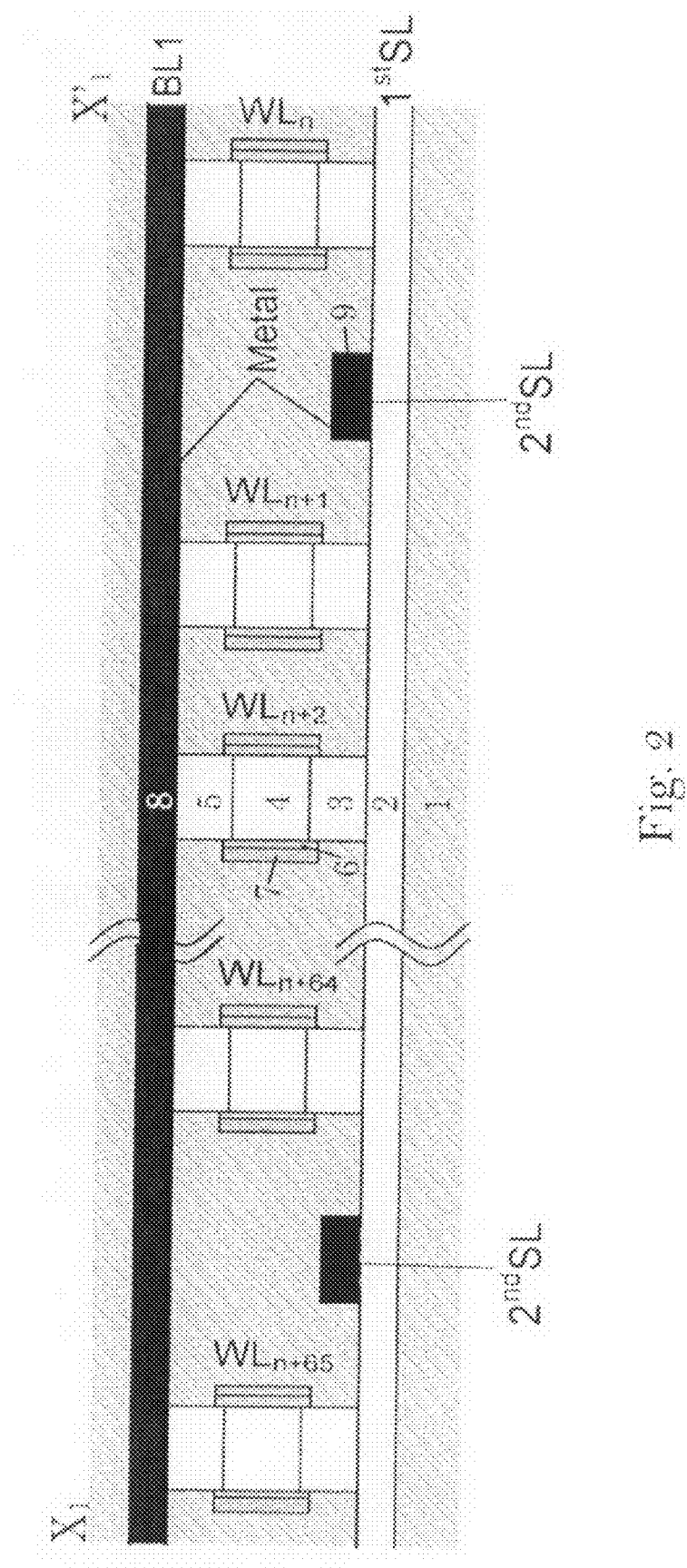
FIG. 2 is a cross-sectional view corresponding to a cross section of the non-volatile semiconductor memory taken along a line $X_1$-$X'_1$ in FIG. 1 according to the present invention.
Figure 3:
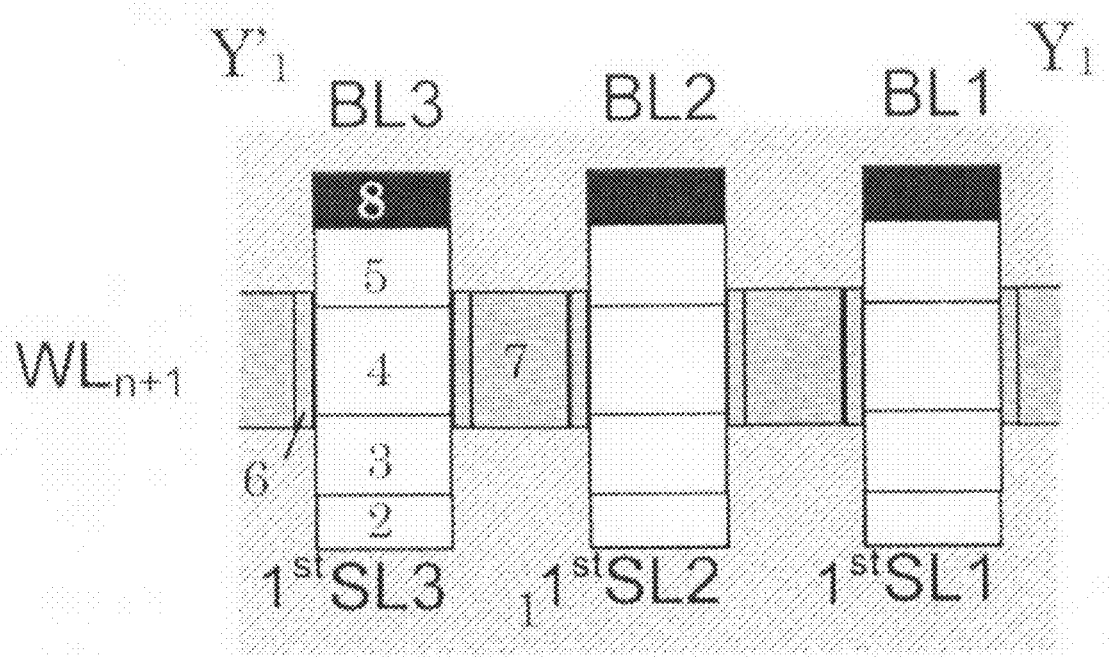
FIG. 3 is a cross-sectional view corresponding to a cross section of the non-volatile semiconductor memory taken along a line $Y_1$-$Y'_1$ in FIG. 1 according to the present invention.
Figure 4:
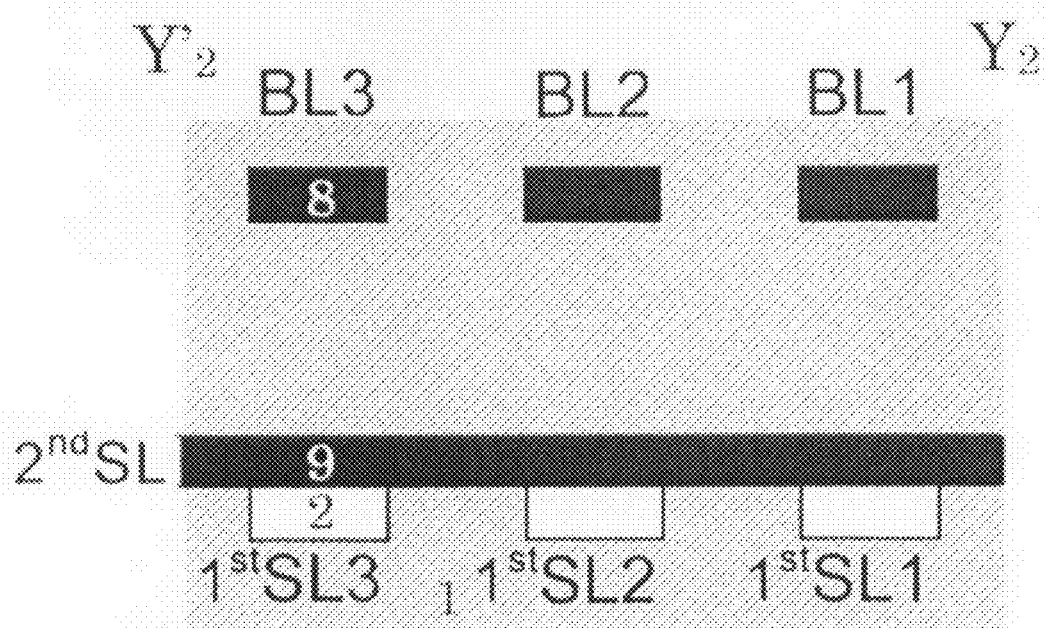
FIG. 4 is a cross-sectional view corresponding to a cross section of the non-volatile semiconductor memory taken along a line $Y_2$-$Y'_2$ in FIG. 1 according to the present invention.
Figure 5:
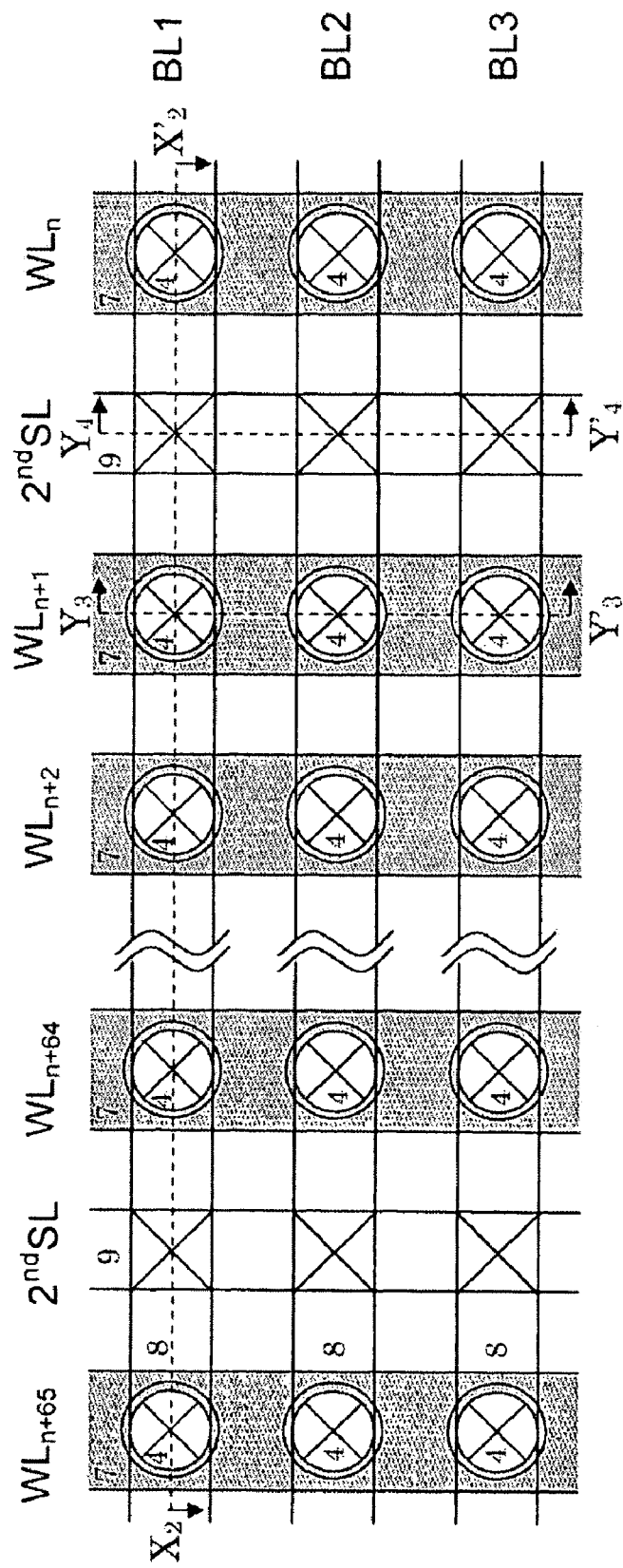
FIG. 5 is a layout of the non-volatile semiconductor memory according to the present invention.
Figure 6:
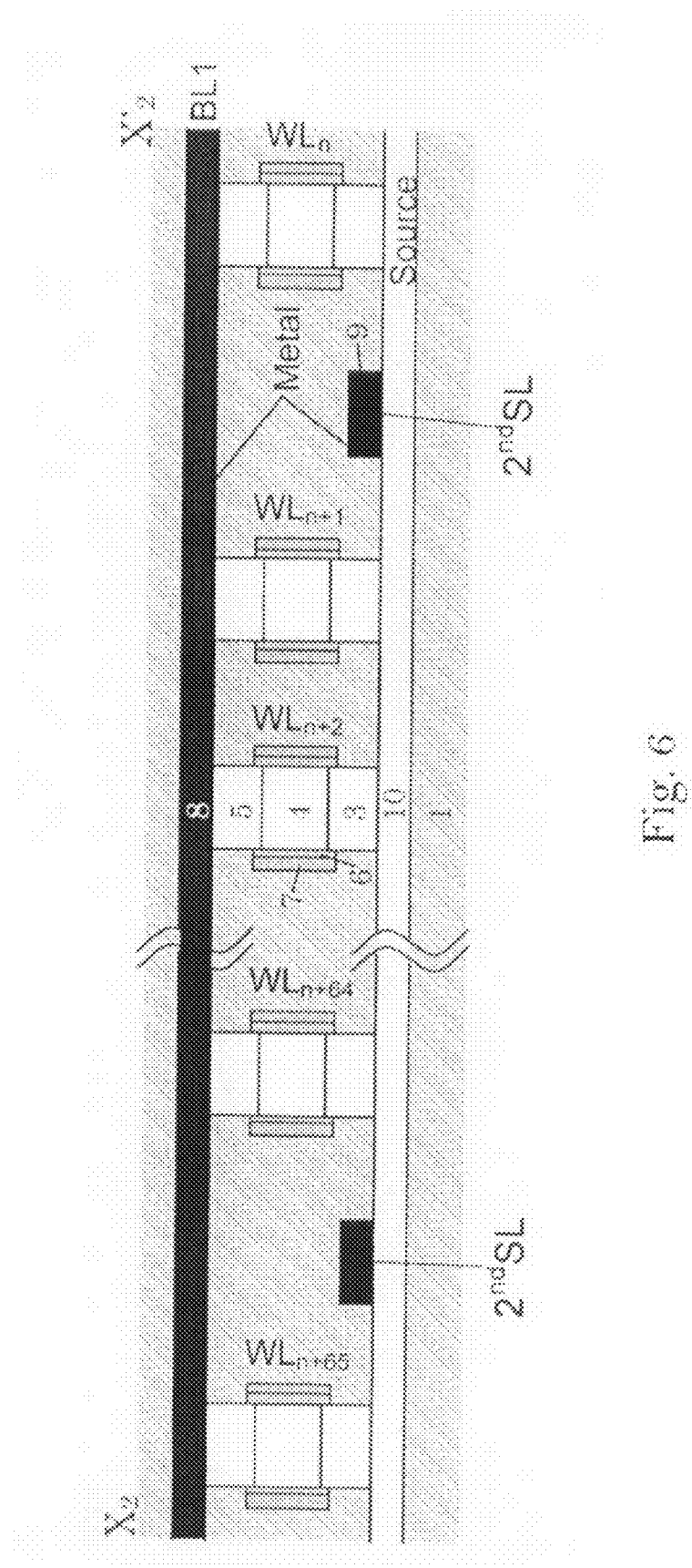
FIG. 6 is a cross-sectional view corresponding to a cross section of the non-volatile semiconductor memory taken along the line $X_1$-$X'_1$ in FIG. 1 according to the present invention.
Figure 7:
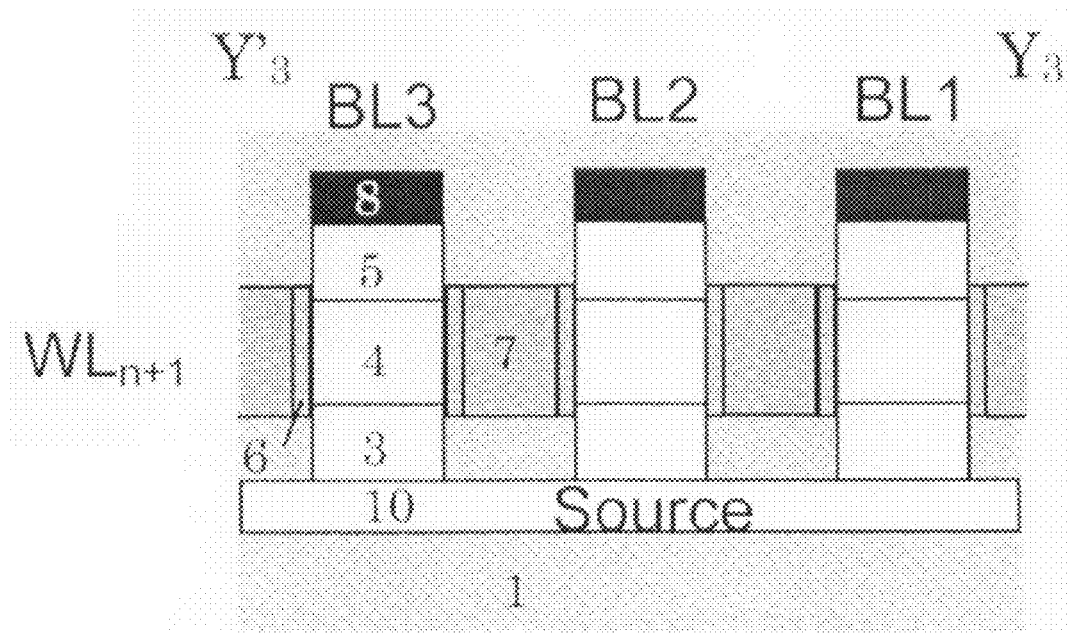
FIG. 7 is a cross-sectional view corresponding to a cross section of the non-volatile semiconductor memory taken along the line $Y_1$-$Y'_1$ in FIG. 1 according to the present invention.
Figure 8:
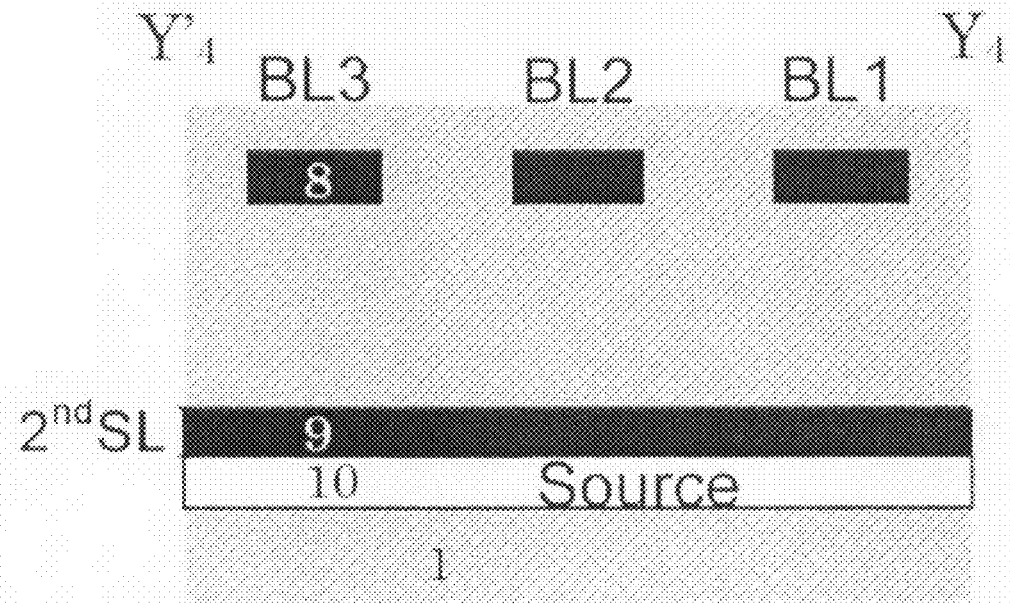
FIG. 8 is a cross-sectional view corresponding to a cross section of the non-volatile semiconductor memory taken along the line $Y_2$-$Y'_2$ in FIG. 1 according to the present invention.

A nonvolatile semiconductor memory according to the present invention includes a number of island semiconductor layers formed on a semiconductor substrate. The island semiconductor layers each include a nonvolatile semiconductor memory cell having a drain diffusion layer formed on top thereof, a source diffusion layer formed on the lower side thereof, a charge-storage layer formed on a channel area on the side wall interposed between the drain diffusion layer and the source diffusion layer via a gate insulation film, and a non-volatile semiconductor memory cell having a control gate formed on the charge-storage layer. The nonvolatile semiconductor memory may have a structure in which the nonvolatile semiconductor memory cells are arranged in matrix, and bit lines connected to the drain diffusion layers are arranged in the column direction, gate lines are arranged in the row direction, and first source lines connected to the source diffusion layers are arranged in the column direction, second source lines formed of metal are arranged in the row direction one each at every predetermined number (sixty-four, for example), and the second source lines are connected at this time to the first source lines.

The nonvolatile semiconductor memory may have a structure in which the nonvolatile semiconductor memory cells are arranged in matrix, the bit lines connected to the drain diffusion layers are arranged in the column direction, control gate lines are arranged in the row direction, and source lines connected to the source diffusion layers are arranged in the column direction. Furthermore, in this nonvolatile semiconductor memory, a structure in which common source lines formed of metal are arranged in the row direction one each every predetermined number (sixty-four, for example) of control gate lines and, at this time, the common source lines are connected to the source lines is also applicable.

The nonvolatile semiconductor memory may have a structure in which the nonvolatile semiconductor memory cells are arranged in matrix on a first common diffusion source line formed of a diffusion layer, the bit lines connected to the drain diffusion layers are arranged in the column direction, and the gate lines are arranged in the row direction. Furthermore, in this nonvolatile semiconductor memory, a structure in which the second source lines formed of metal are arranged in the row direction one each every predetermined number (sixty-four, for example) of gate lines and, at this time, the second source lines are connected to the first common diffusion source line is also applicable.

The method of driving of the present invention is able to inject the electric charge to the charge-storage layer using hot electrons to a selected memory cell by applying a first voltage of 0V or a positive value to a selected bit line, applying a voltage of 0V to non-selected bit lines, applying a second voltage of a positive value to a selected gate line, applying a voltage of 0V to non-selected gate lines, and applying a voltage of 0V to a first source line or a first common diffusion source line and second source lines.

The method of driving of the present invention is able to read out a selected memory cell by applying a first voltage of a positive value to a selected gate line, applying a voltage of 0V to non-selected gate lines, applying a voltage of 0V to first source lines or a first common diffusion source line and second source lines, and applying a second voltage of a positive value to a selected bit line.

The method of driving of the present invention is able to discharge an electric charge from a charge-storage layer of all memory cells using FN tunnel current by applying a first voltage of a positive value to bit lines and a first source line or a first common diffusion source line and second source lines, and applying a voltage of 0V to gate lines.

The method of driving of the present invention is able to discharge an electric charge from a charge-storage layer of all memory cells connected to a selected gate line using FN tunnel current by applying a first voltage of a positive value to bit lines and first source lines or a first common diffusion source line and second source lines, applying a voltage of 0V to the selected gate line, and applying a second voltage of a positive value to non-selected gate lines.

EXAMPLES

Referring now to the embodiment shown in the drawings, the present invention will be described. The present invention is not limited thereby.

A layout and a cross-sectional structure of a nonvolatile semiconductor memory according to the present invention will be shown in FIG. 1, FIG. 2, FIG. 3, and FIG. 4 respectively. In this example, first source lines 2 and source diffusion layers 3 are formed on a silicon oxide film 1, island semiconductor layers 4 are formed thereon, drain diffusion layers 5 are formed on top of the island semiconductor layers 4, charge-storage layers 6 formed via gate insulating films are formed on channel areas on side walls interposed between the drain diffusion layers 5 and the source diffusion layers 3, and control gates are formed on the charge-storage layers 6, whereby memory cells are formed. Lines arranged in the row direction so as to connect the control gates of the memory cells with each other are referred to as gate lines 7. Bit lines are formed on the drain diffusion layers. Second source lines 9 formed of metal and assigned to rows are formed on the first source lines one each at every predetermined number of gate lines (sixty four in this case).

A layout and a cross-sectional structure of a nonvolatile semiconductor memory according to the present invention will be shown in FIG. 5, FIG. 6, FIG. 7, and FIG. 8 respectively. In this example, a first common diffusion source line 10 and the source diffusion layers 3 are formed on the silicon oxide film 1, the island semiconductor layers 4 are formed thereon, the drain diffusion layers 5 are formed on top of the island semiconductor layers 4, the charge-storage layers 6 formed via gate insulating films are formed on channel areas on side walls interposed between the drain diffusion layers 5 and the source diffusion layers 3, and control gates are formed on the charge-storage layers 6, whereby memory cells are formed. Lines arranged in the row direction so as to connect the control gates of the memory cells with each other are referred to as gate lines 7. The bit lines 8 are formed on the drain diffusion layers. The second source lines 9 formed of metal and assigned to rows are formed on the first common diffusion source line one each at every predetermined number of gate lines (sixty four in this case).

Figure 9:
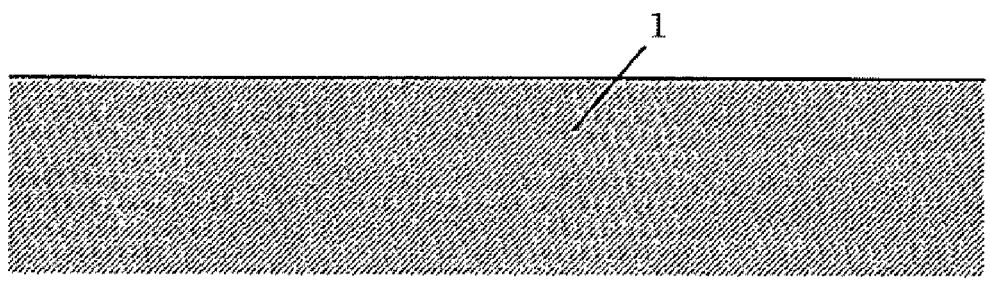
FIG. 9 is a process drawing showing an example of manufacture of a memory cell array taken along the line $X_1$-$X'_1$ according to the present invention.
Figure 10:
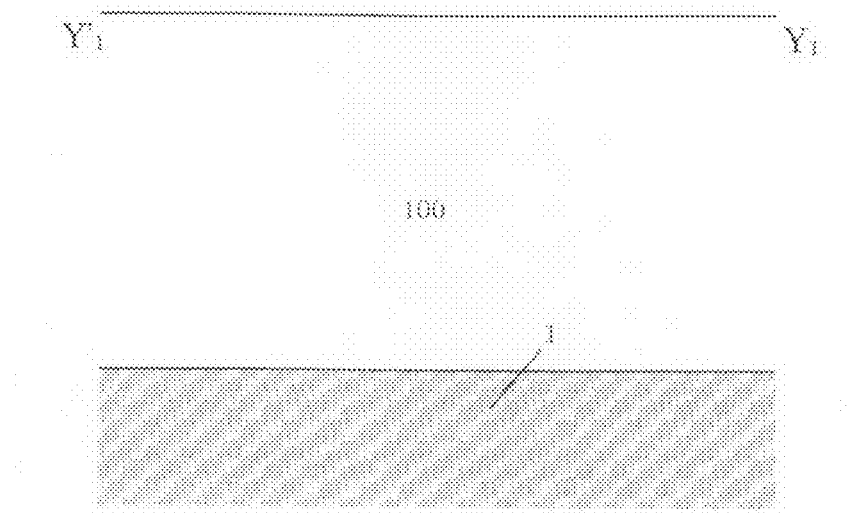
FIG. 10 is a process drawing showing an example of manufacture of the memory cell array taken along the line $Y_1$-$Y'_1$ according to the present invention.
Figure 11:
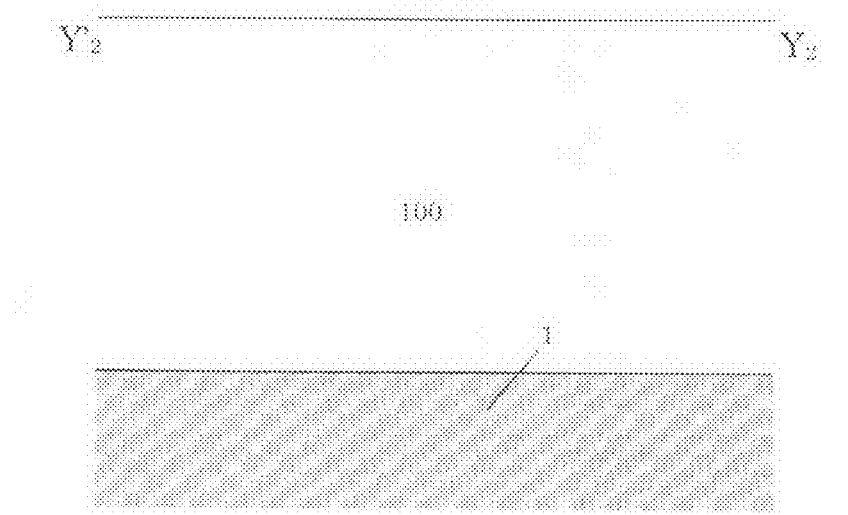
FIG. 11 is a process drawing showing an example of manufacture of the memory cell array taken along the line $Y_2$-$Y'_2$ according to the present invention.
Figure 65:
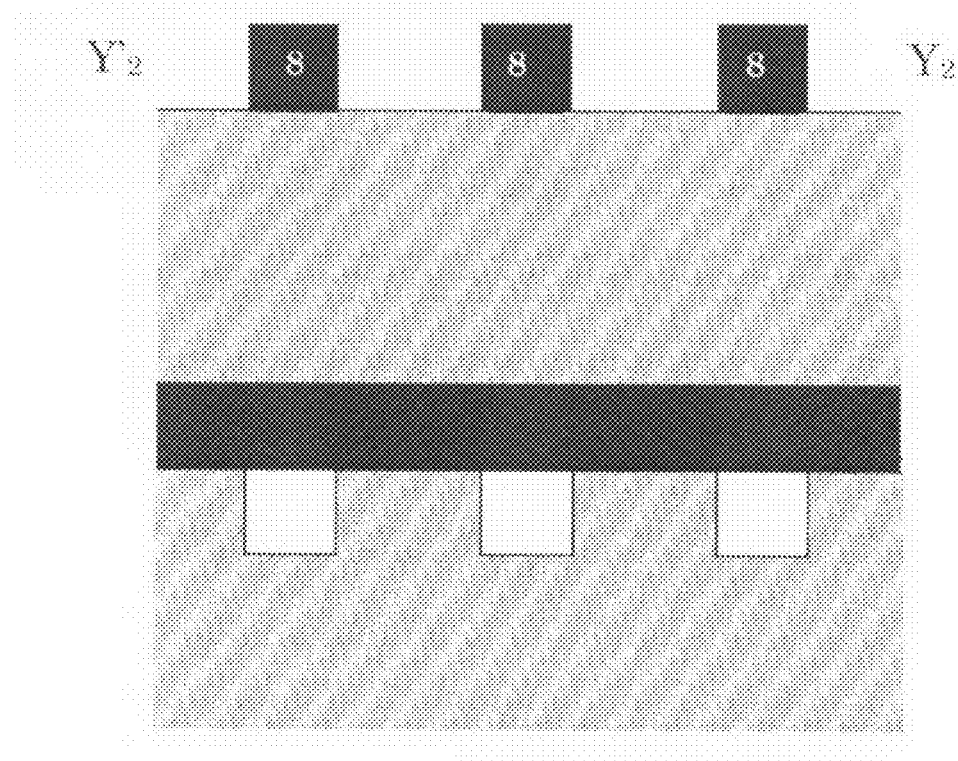
FIG. 65 is a process drawing showing an example of manufacture of the memory cell array taken along the line $Y_2$-$Y'_2$ according to the present invention.

Referring now to FIG. 9 to FIG. 65, an example of a manufacturing process for forming a structure of a memory cell array provided on the nonvolatile semiconductor memory according to the present invention will be described. FIG. 9 is a cross-sectional view of an SOI substrate formed with a P-type silicon 100 on the silicon oxide film 1 taken along the line $X_1$-$X'_1$. FIG. 10 is a cross-sectional view taken along the line Y-$Y'_1$, and FIG. 11 is a cross sectional view taken along the line $Y_2$-$Y'_2$. The cross section taken along the line $X_1$-$X'_1$ corresponds to FIG. 2, the cross-section taken along the line $Y_1$-$Y'_1$ corresponds to FIG. 3, and the cross-section taken along the line $Y_2$-$Y'_2$ corresponds to FIG. 3.

Figure 12:
FIG. 12 is a process drawing showing an example of manufacture of the memory cell array taken along the line $X_1$-$X'_1$ according to the present invention.
Figure 13:
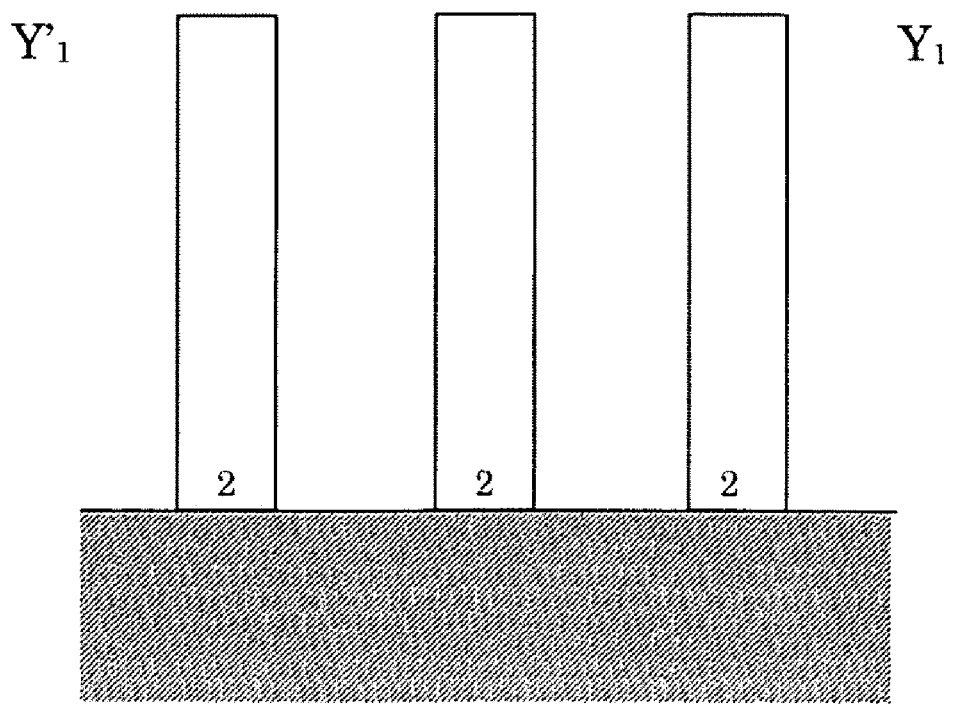
FIG. 13 is a process drawing showing an example of manufacture of the memory cell array taken along the line $Y_1$-$Y'_1$ according to the present invention.
Figure 14:
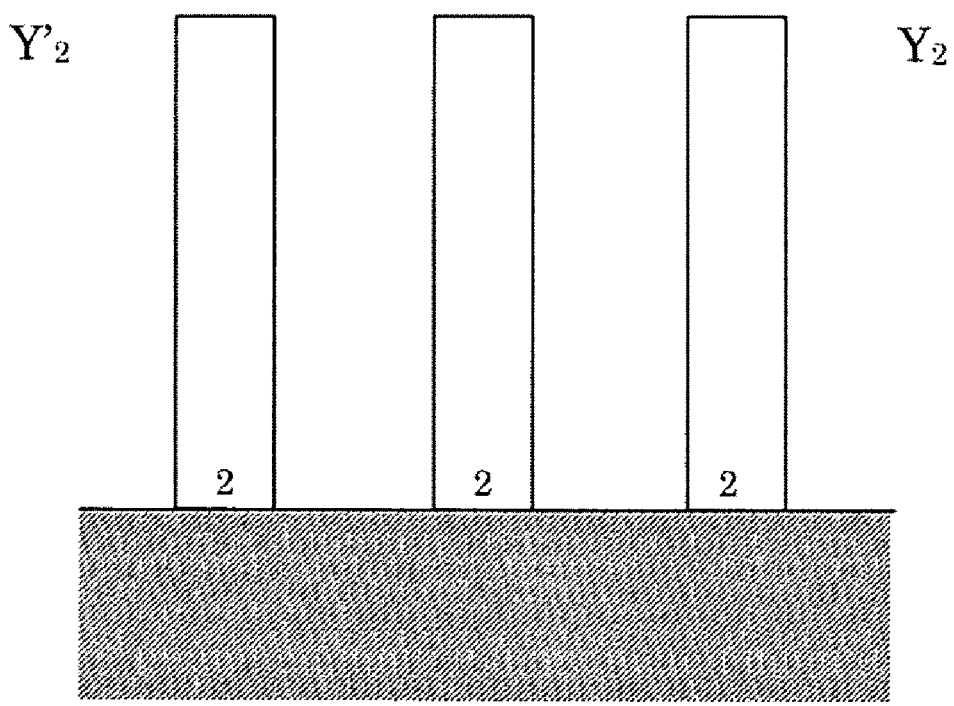
FIG. 14 is a process drawing showing an example of manufacture of the memory cell array taken along the line $Y_2$-$Y'_2$ according to the present invention.

The first source lines 2 are formed by etching the P-type silicon 100 by reactive ion etching using a resist as a mask (FIG. 12 ($X_1$-$X'_1$), FIG. 13 ($Y_1$-$Y'_1$), FIG. 14 ($Y_2$-$Y'_2$)).

Figure 15:
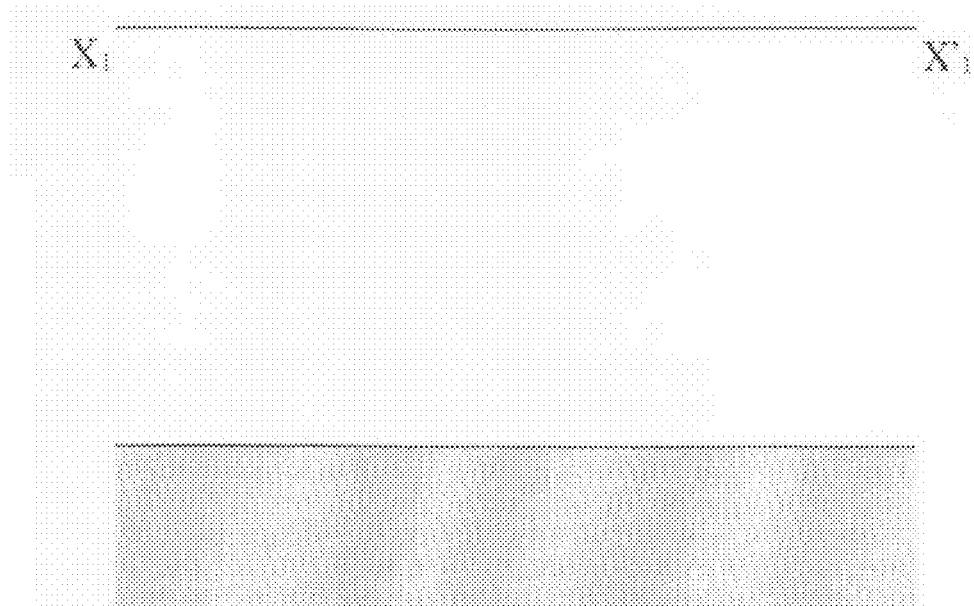
FIG. 15 is a process drawing showing an example of manufacture of the memory cell array taken along the line $X_1$-$X'_1$ according to the present invention.
Figure 16:
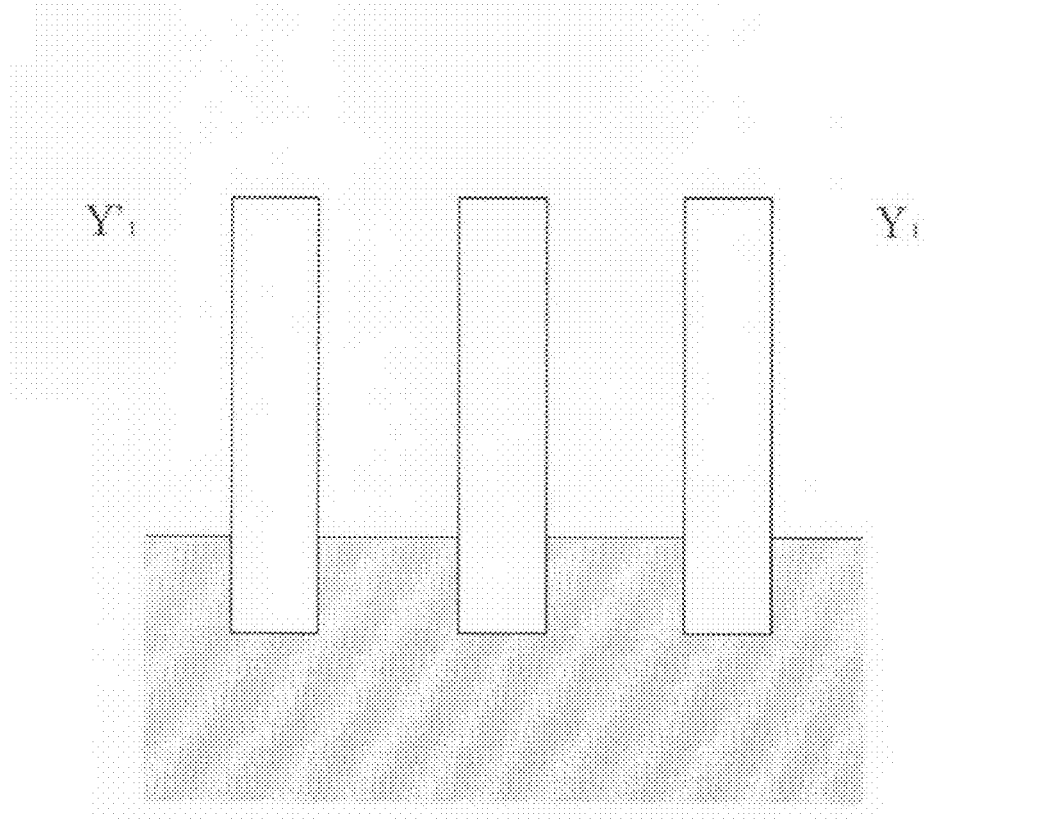
FIG. 16 is a process drawing showing an example of manufacture of the memory cell array taken along the line $Y_1$-$Y'_1$ according to the present invention.
Figure 17:
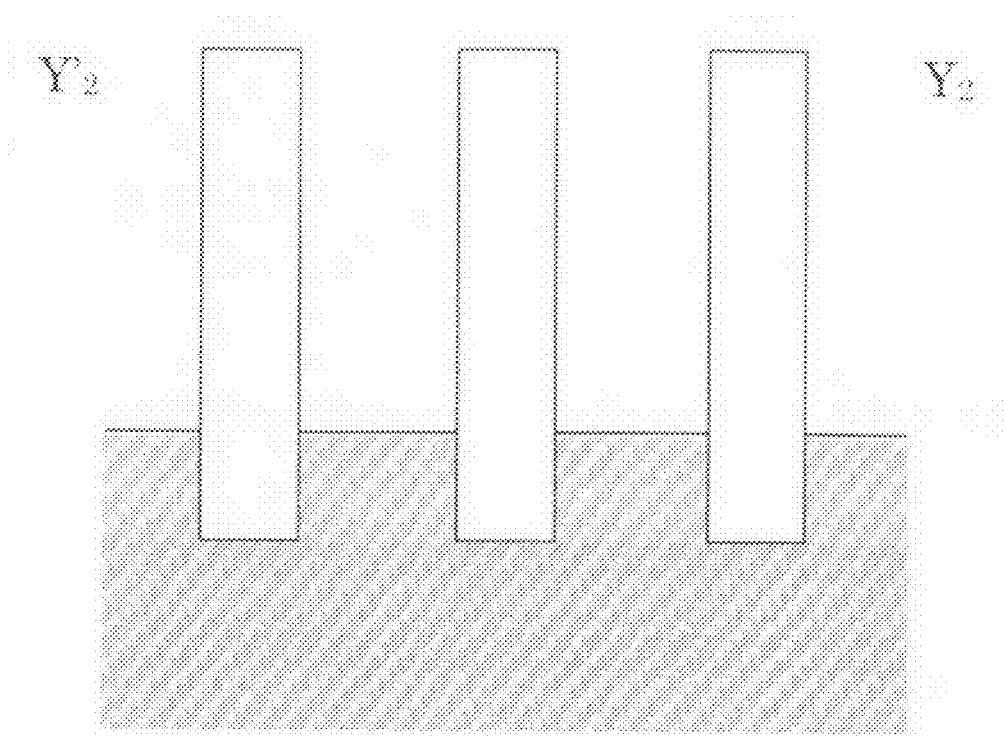
FIG. 17 is a process drawing showing an example of manufacture of the memory cell array taken along the line $Y_2$-$Y'_2$ according to the present invention.

An oxide film is accumulated and is flattened by CMP, and etched back using the reactive ion etching (FIG. 15 ($X_1$-$X'_1$), FIG. 16 ($Y_1$-$Y'_1$), FIG. 17 ($Y_2$-$Y'_2$)).

Figure 18:
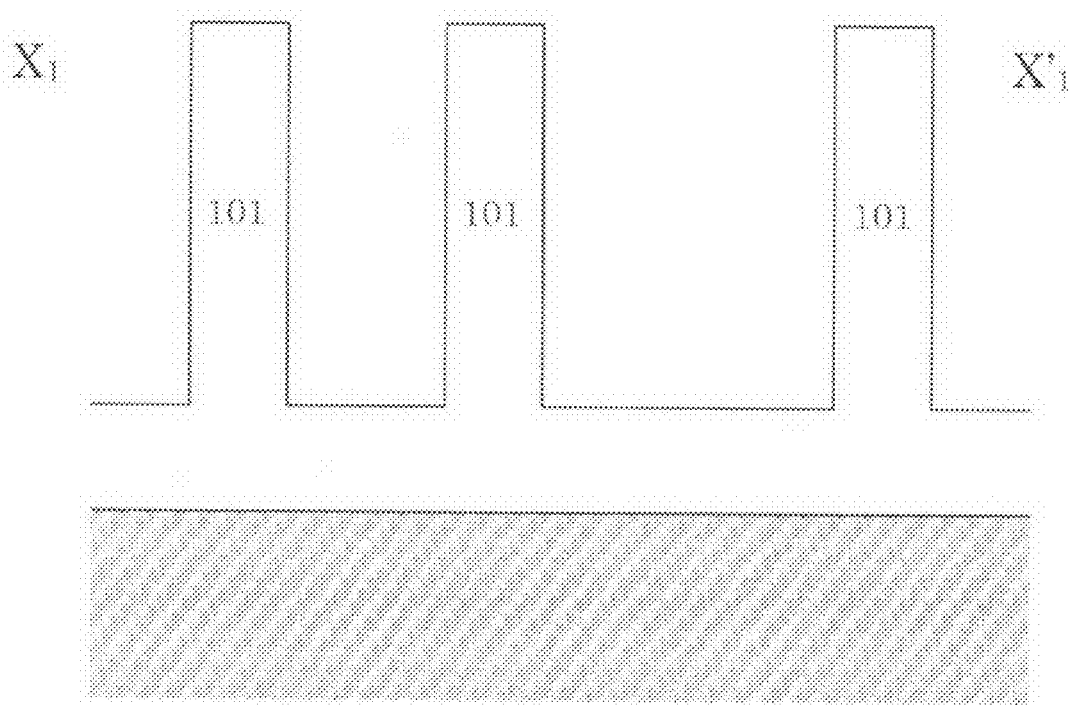
FIG. 18 is a process drawing showing an example of manufacture of the memory cell array taken along the line $X_1$-$X'_1$ according to the present invention.
Figure 19:
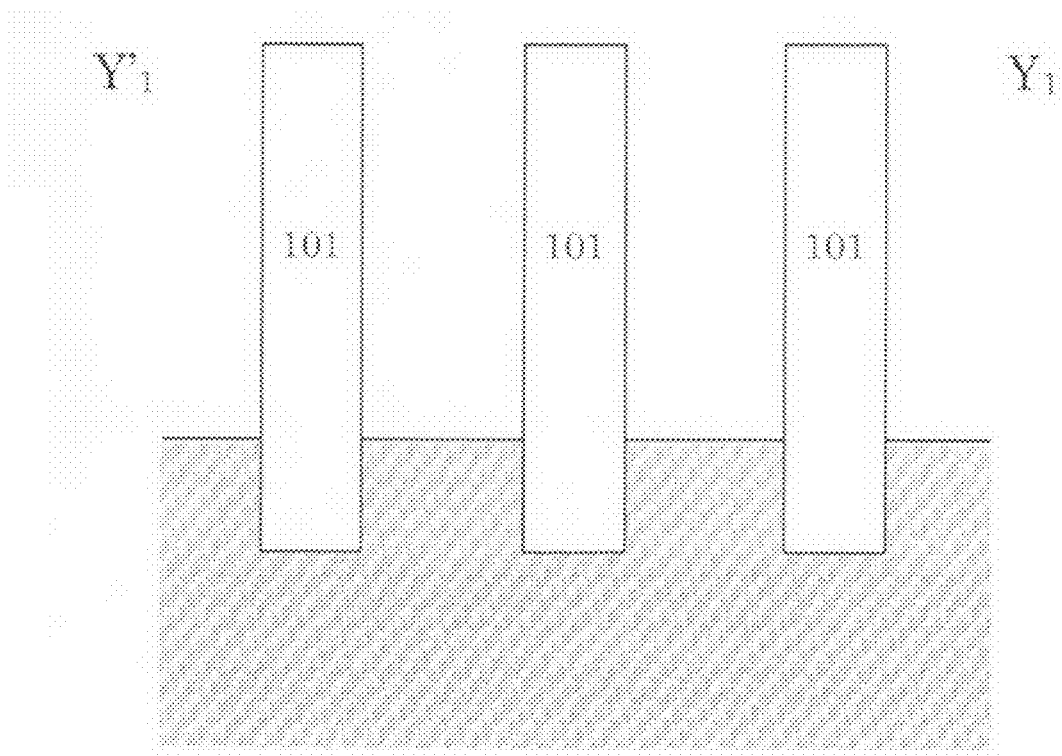
FIG. 19 is a process drawing showing an example of manufacture of the memory cell array taken along the line $Y_1$-$Y'_1$ according to the present invention.
Figure 20:
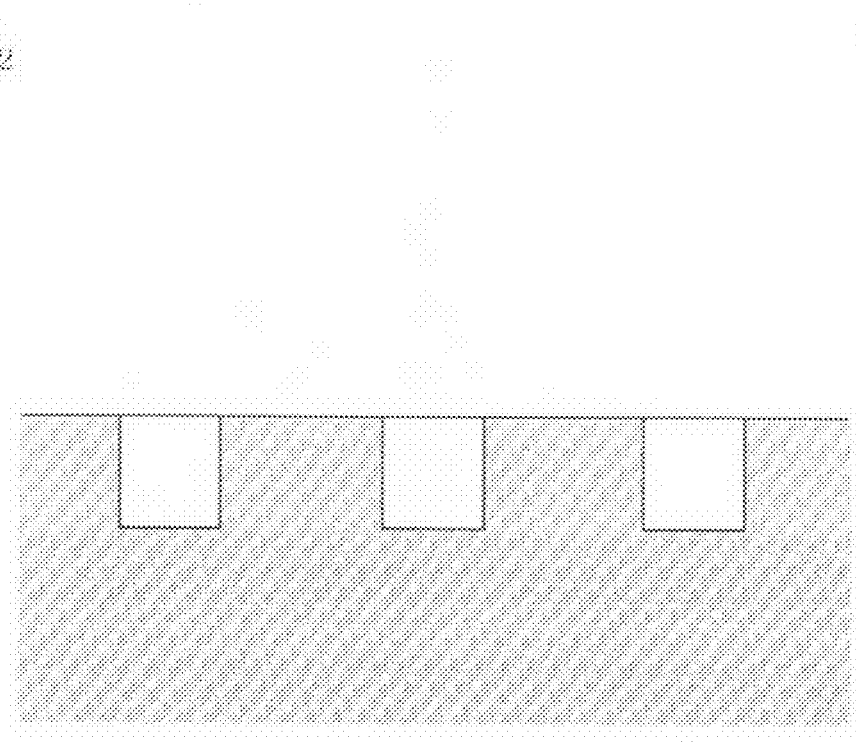
FIG. 20 is a process drawing showing an example of manufacture of the memory cell array taken along the line $Y_2$-$Y'_2$ according to the present invention.

The island semiconductor layers 101 are formed by etching the P-type silicon 100 by reactive ion etching using a resist as a mask (FIG. 18 ($X_1$-$X'_1$), FIG. 19 ($Y_1$-$Y'_1$), FIG. 20 ($Y_2$-$Y'_2$)).

The lower portions of the island semiconductor layers 101 correspond to the first source lines.

Figure 21:
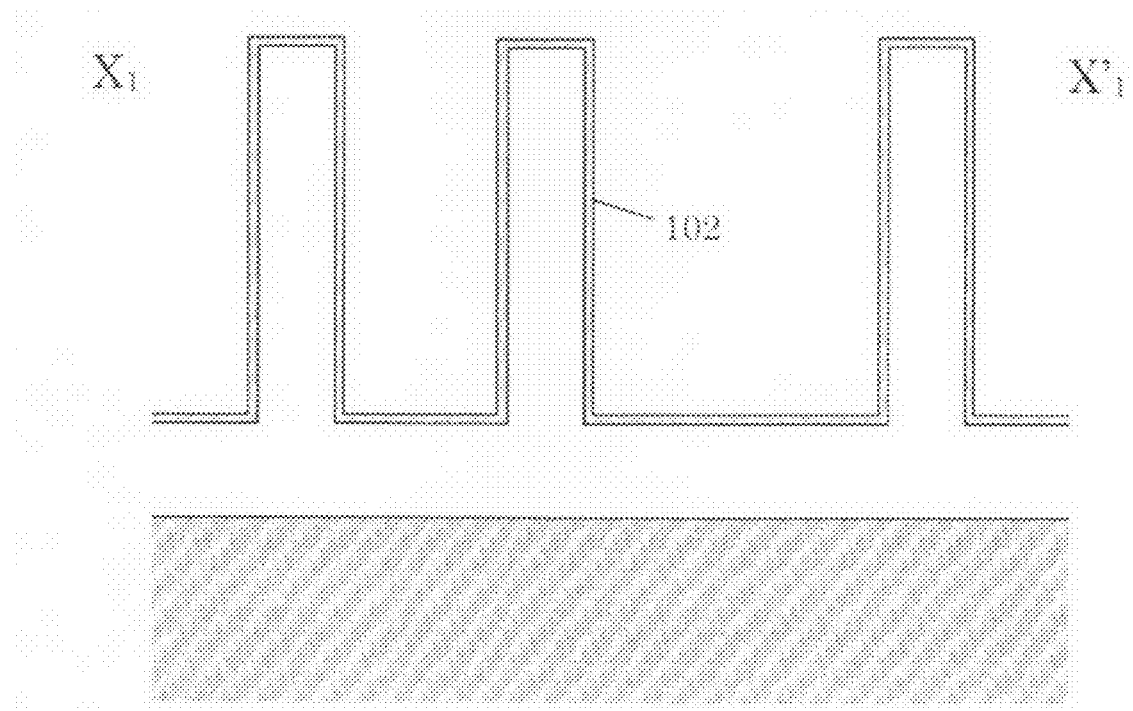
FIG. 21 is a process drawing showing an example of manufacture of the memory cell array taken along the line $X_1$-$X'_1$ according to the present invention.
Figure 22:
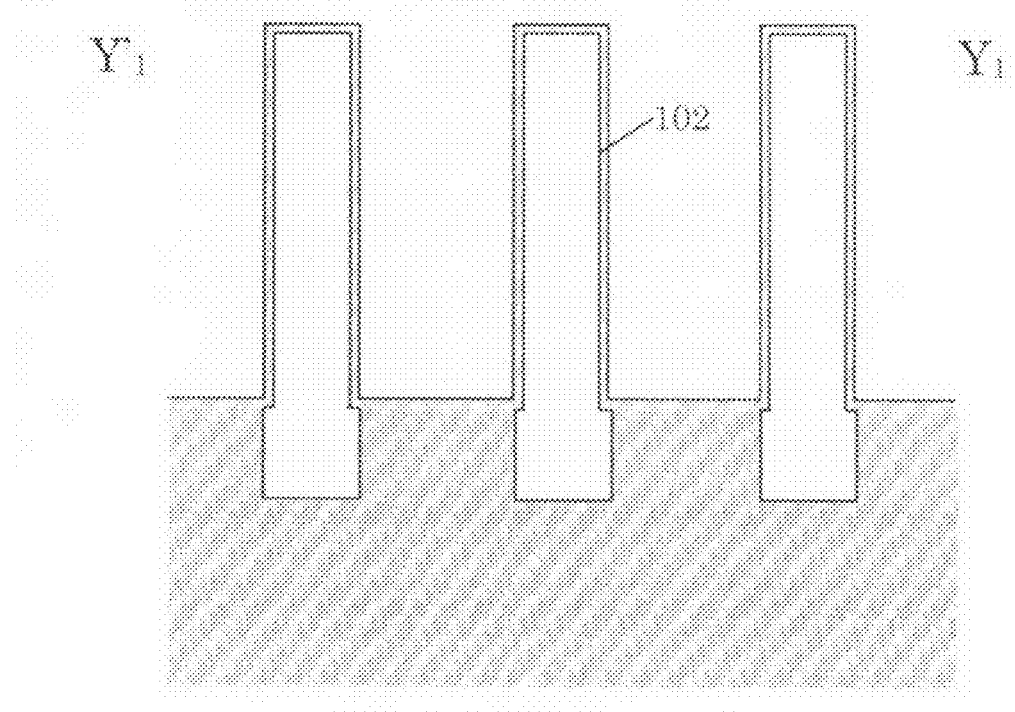
FIG. 22 is a process drawing showing an example of manufacture of the memory cell array taken along the line $Y_1$-$Y'_1$ according to the present invention.
Figure 23:
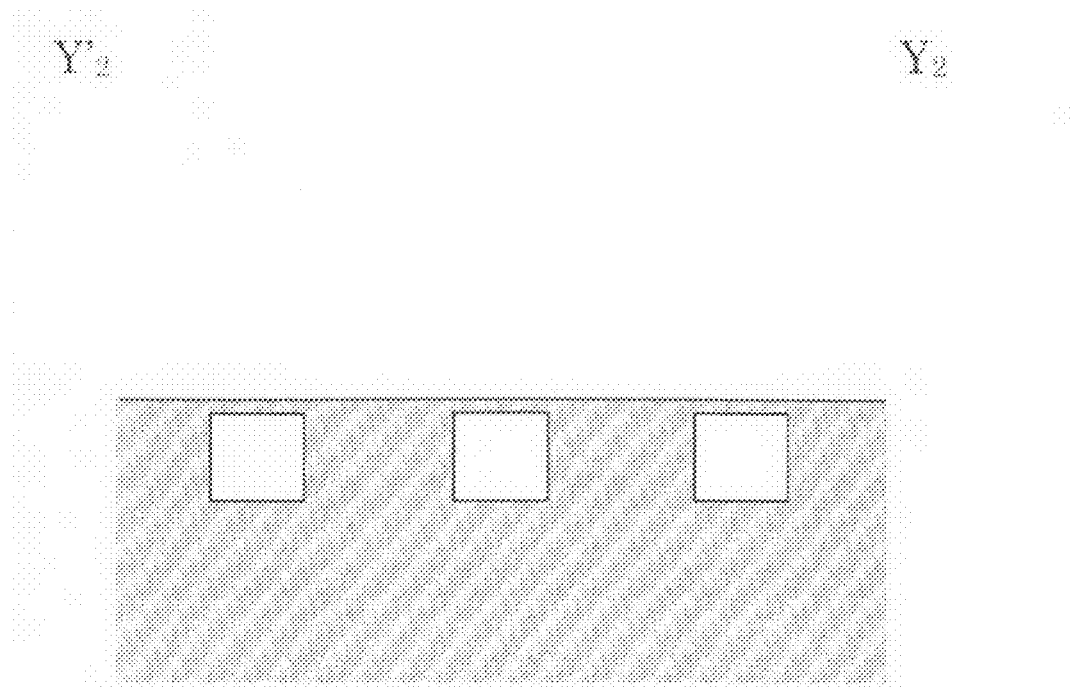
FIG. 23 is a process drawing showing an example of manufacture of the memory cell array taken along the line $Y_2$-$Y'_2$ according to the present invention.

Subsequently, oxidation is performed to form tunnel insulating films 102 (FIG. 21 (X1-X'1), FIG. 22(Y1-Y'1), FIG. 23(Y2-Y'2)).

Figure 24:
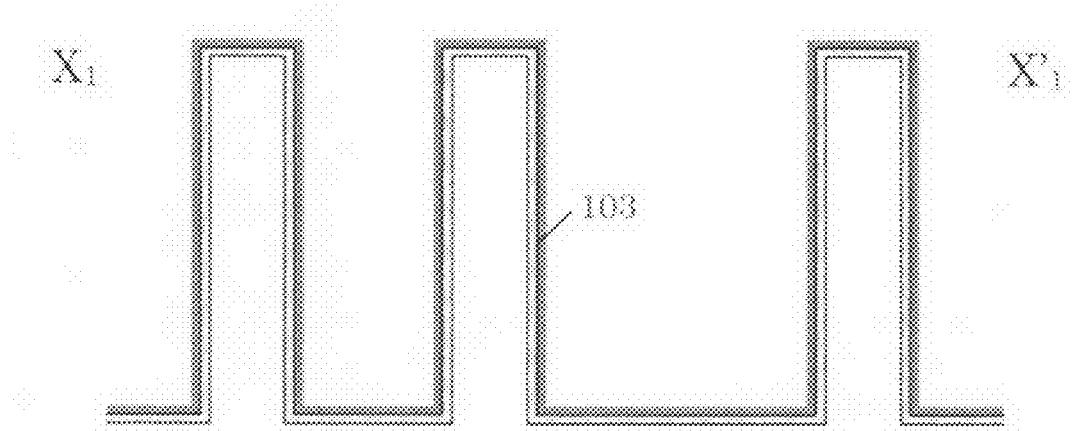
FIG. 24 is a process drawing showing an example of manufacture of the memory cell array taken along the line $X_1$-$X'_1$ according to the present invention.
Figure 25:
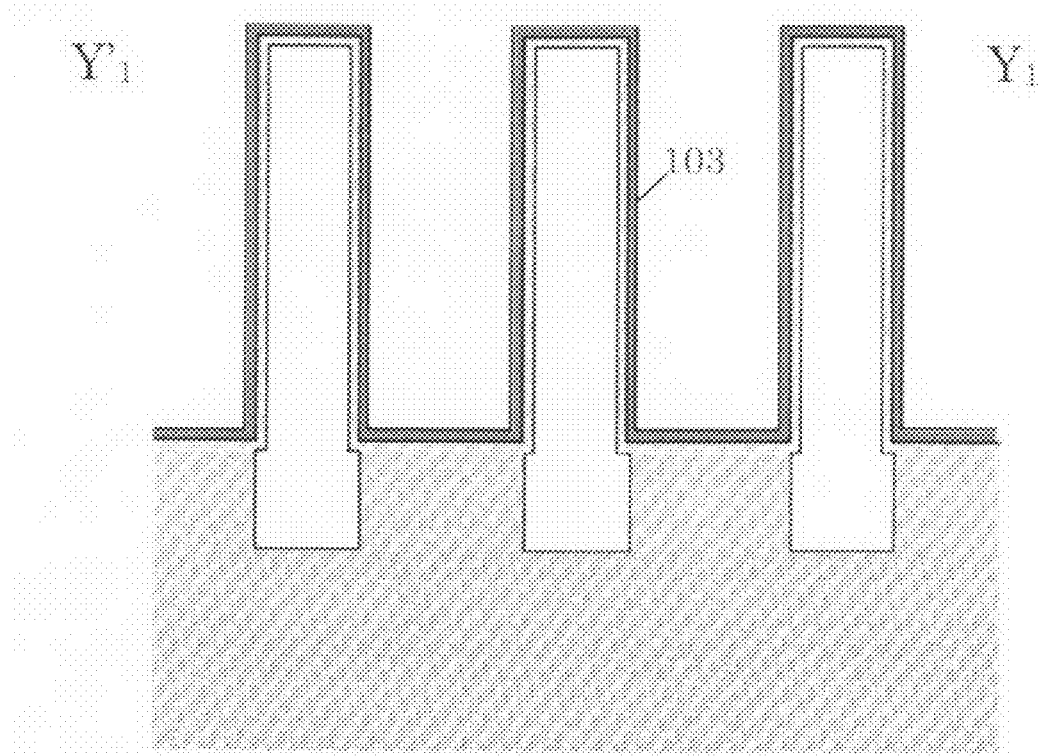
FIG. 25 is a process drawing showing an example of manufacture of the memory cell array taken along the line $Y_1$-$Y'_1$ according to the present invention.
Figure 26:
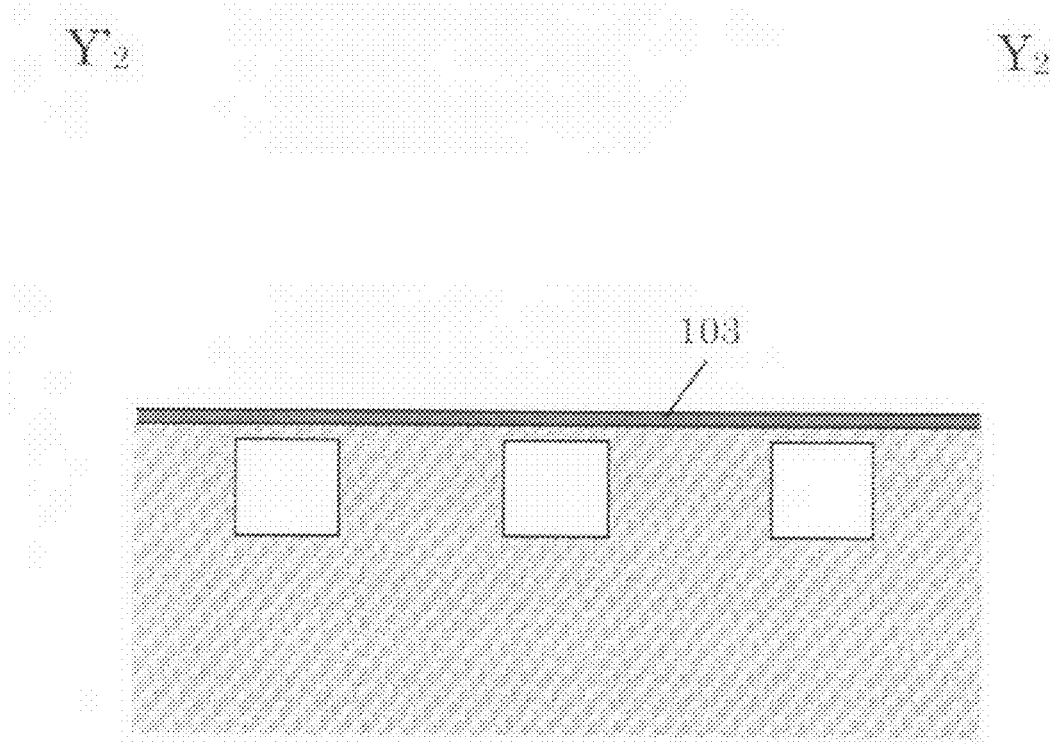
FIG. 26 is a process drawing showing an example of manufacture of the memory cell array taken along the line $Y_2$-$Y'_2$ according to the present invention.

Subsequently, a polycrystal silicone film 103 is accumulated (FIG. 24 (X1-X'1), FIG. 25 (Y1-Y'1), FIG. 26 (Y2-Y'2)).

Figure 27:
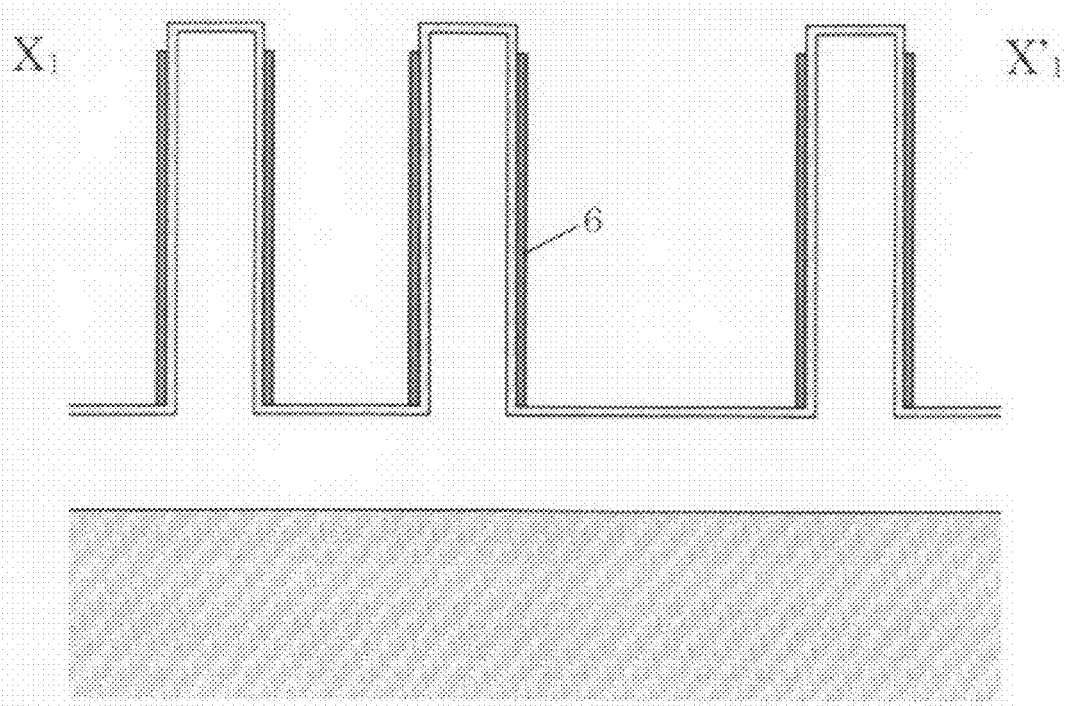
FIG. 27 is a process drawing showing an example of manufacture of the memory cell array taken along the line $X_1$-$X'_1$ according to the present invention.
Figure 28:
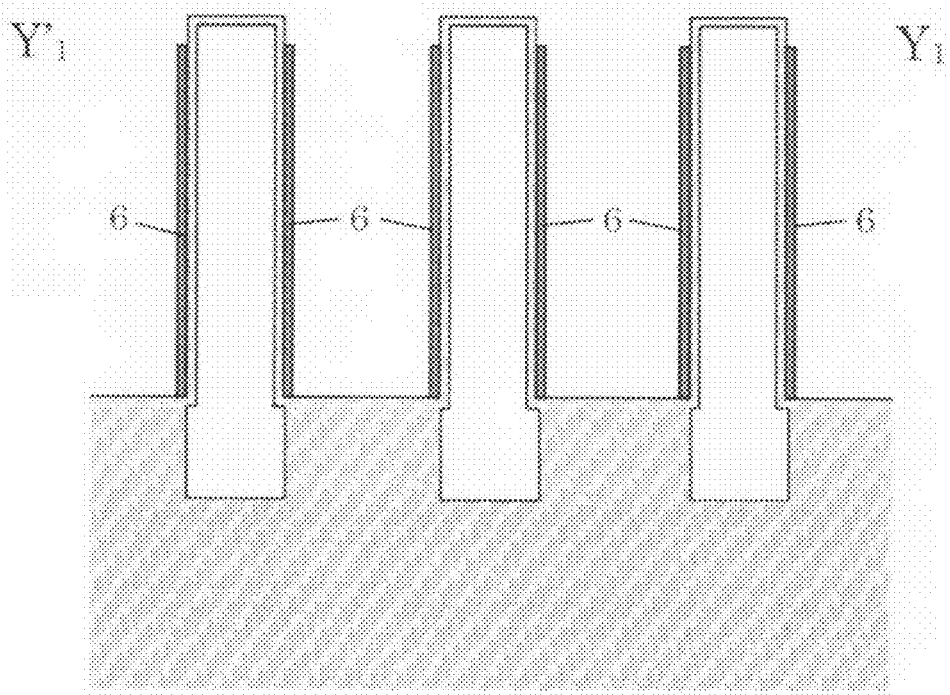
FIG. 28 is a process drawing showing an example of manufacture of the memory cell array taken along the line $Y_1$-$Y'_1$ according to the present invention.
Figure 29:
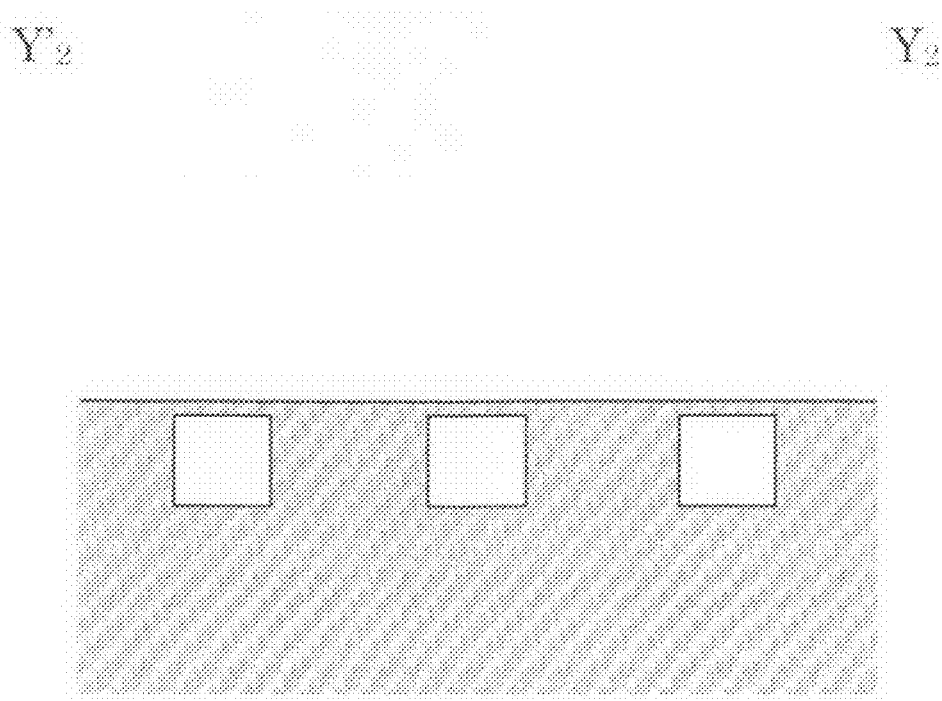
FIG. 29 is a process drawing showing an example of manufacture of the memory cell array taken along the line $Y_2$-$Y'_2$ according to the present invention.

Subsequently, the polycrystal silicon film is etched by the reactive ion etching and is made to remain in the shape of a sidewall spacers on the side walls of the island semiconductor to form the charge-storage layers 6 (FIG. 27 (X1-X'1), FIG. 28 (Y1-Y'1), FIG. 29 (Y2-Y'2)).

Figure 30:
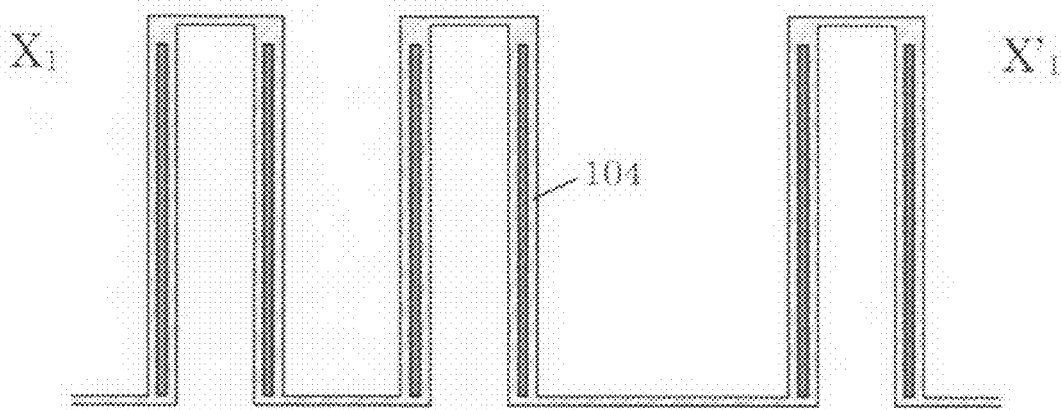
FIG. 30 is a process drawing showing an example of manufacture of the memory cell array taken along the line $X_1$-$X'_1$ according to the present invention.
Figure 31:
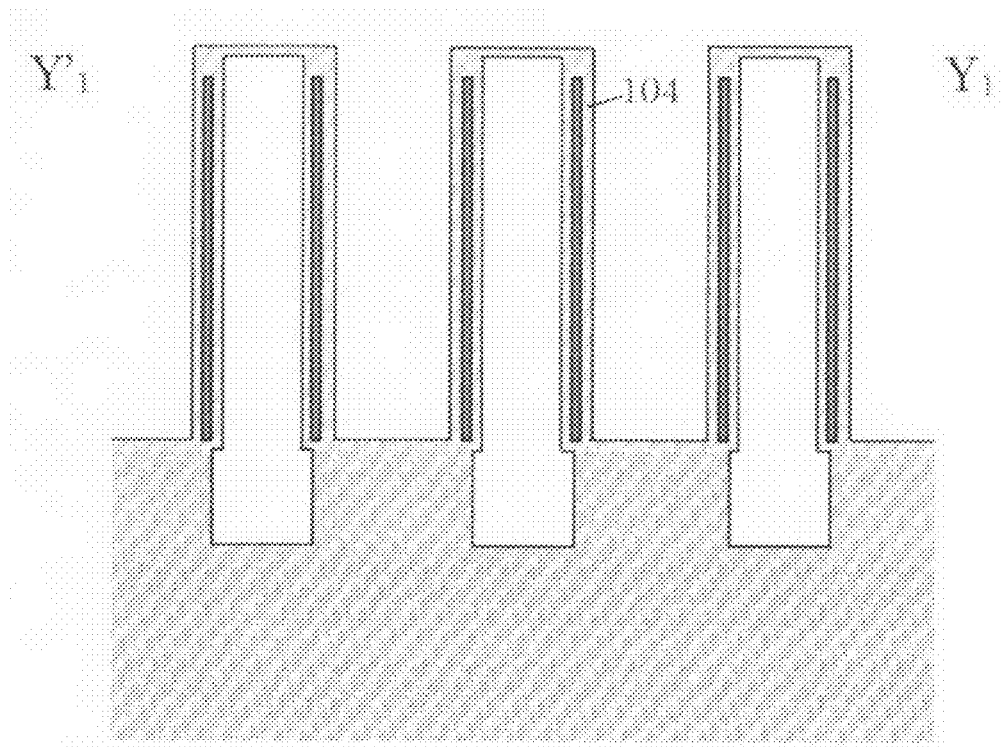
FIG. 31 is a process drawing showing an example of manufacture of the memory cell array taken along the line $Y_1$-$Y'_1$ according to the present invention.
Figure 32:
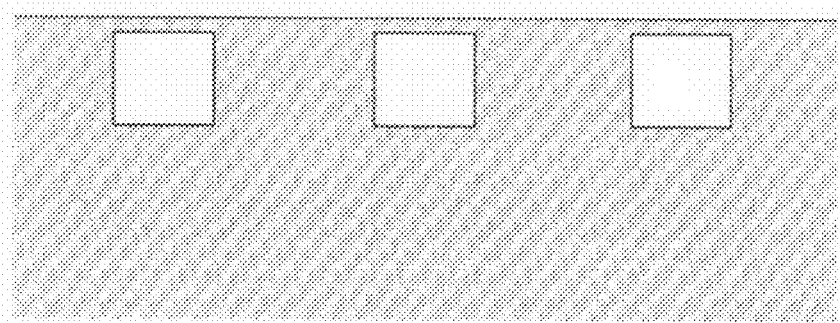
FIG. 32 is a process drawing showing an example of manufacture of the memory cell array taken along the line $Y_2$-$Y'_2$ according to the present invention.

Subsequently, oxidation is performed to form an interpoly insulating film 104 (FIG. 30 (X1-X'1), FIG. 31 (Y1-Y'1), FIG. 32 (Y2-Y'2)). It is also applicable to accumulate an insulating film by CVD.

Figure 33:
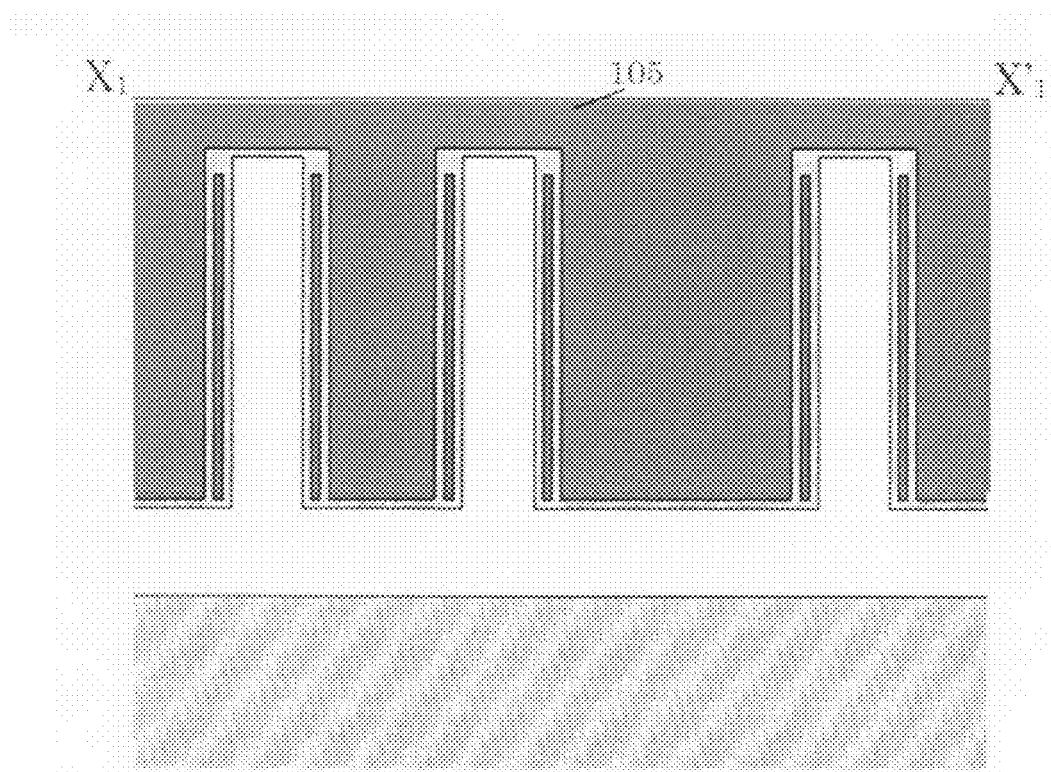
FIG. 33 is a process drawing showing an example of manufacture of the memory cell array taken along the line $X_1$-$X'_1$ according to the present invention.
Figure 34:
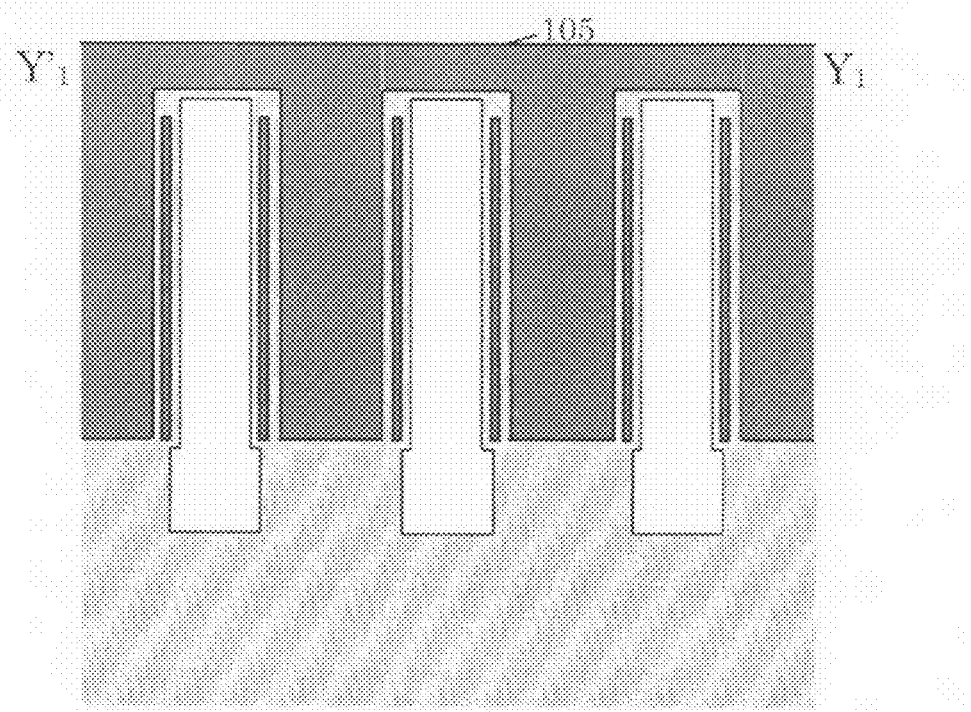
FIG. 34 is a process drawing showing an example of manufacture of the memory cell array taken along the line $Y_1$-$Y'_1$ according to the present invention.
Figure 35:
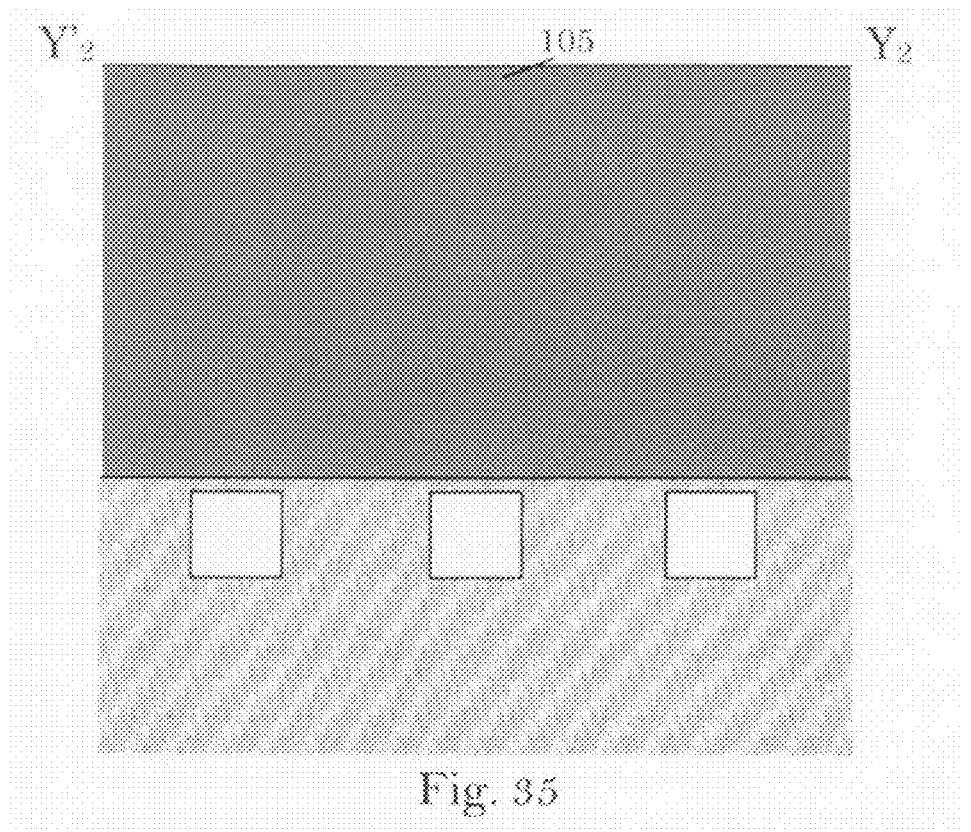
FIG. 35 is a process drawing showing an example of manufacture of the memory cell array taken along the line $Y_2$-$Y'_2$ according to the present invention.

Subsequently, the polycrystal silicon film 105 is accumulated (FIG. 33 (X1-X'1), FIG. 34 (Y1-Y'1), FIG. 35 (Y2-Y'2)).

Figure 36:
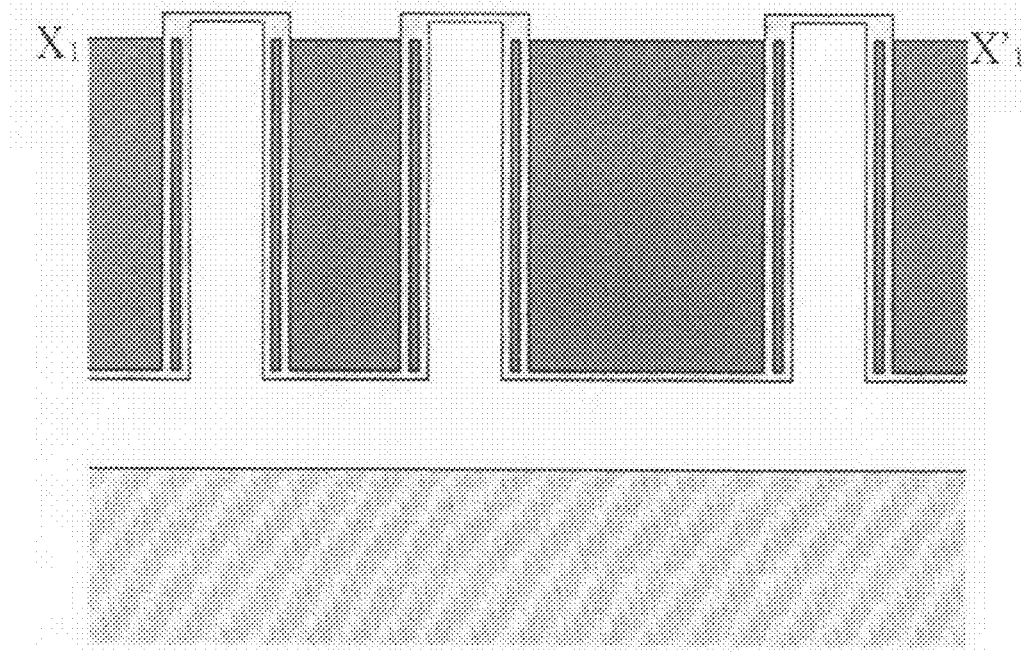
FIG. 36 is a process drawing showing an example of manufacture of the memory cell array taken along the line $X_1$-$X'_1$ according to the present invention.
Figure 37:
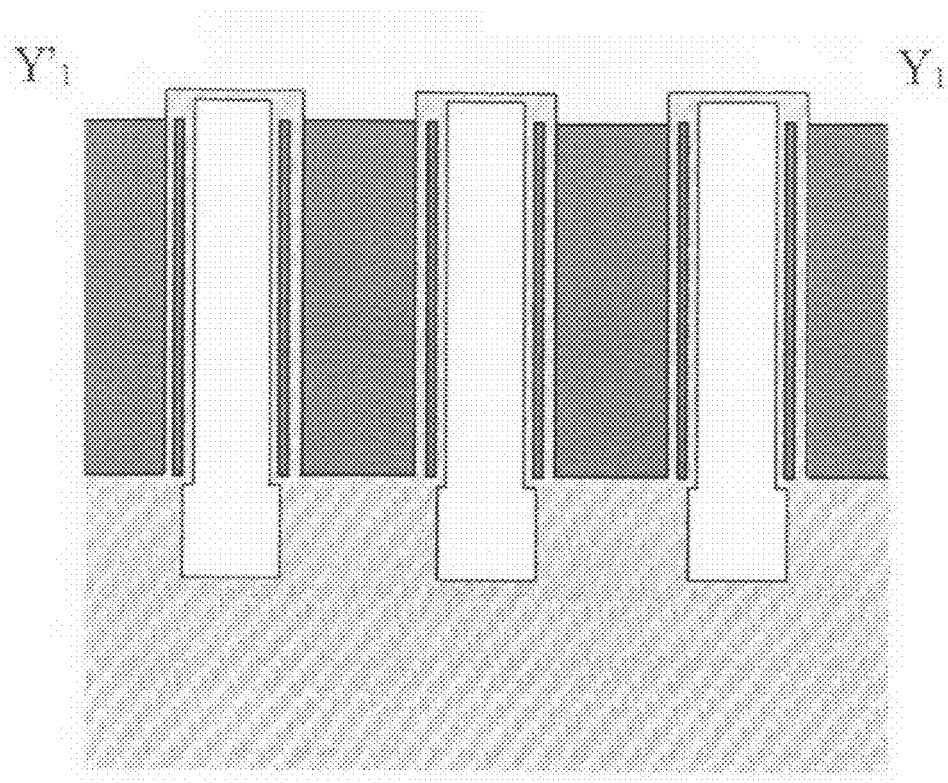
FIG. 37 is a process drawing showing an example of manufacture of the memory cell array taken along the line $Y_1$-$Y'_1$ according to the present invention.
Figure 38:
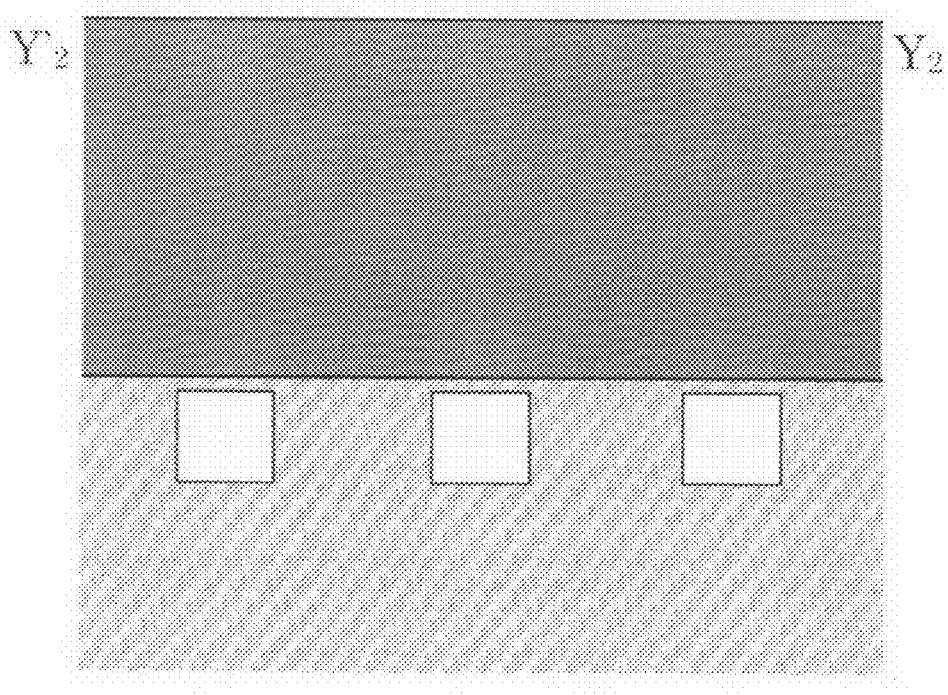
FIG. 38 is a process drawing showing an example of manufacture of the memory cell array taken along the line $Y_2$-$Y'_2$ according to the present invention.

Subsequently, the polycrystal silicon film is flattened by the CMP and then etched back (FIG. 36 (X1-X'1), FIG. 37 (Y1-Y'1), FIG. 38 (Y2-Y'2)).

Figure 39:
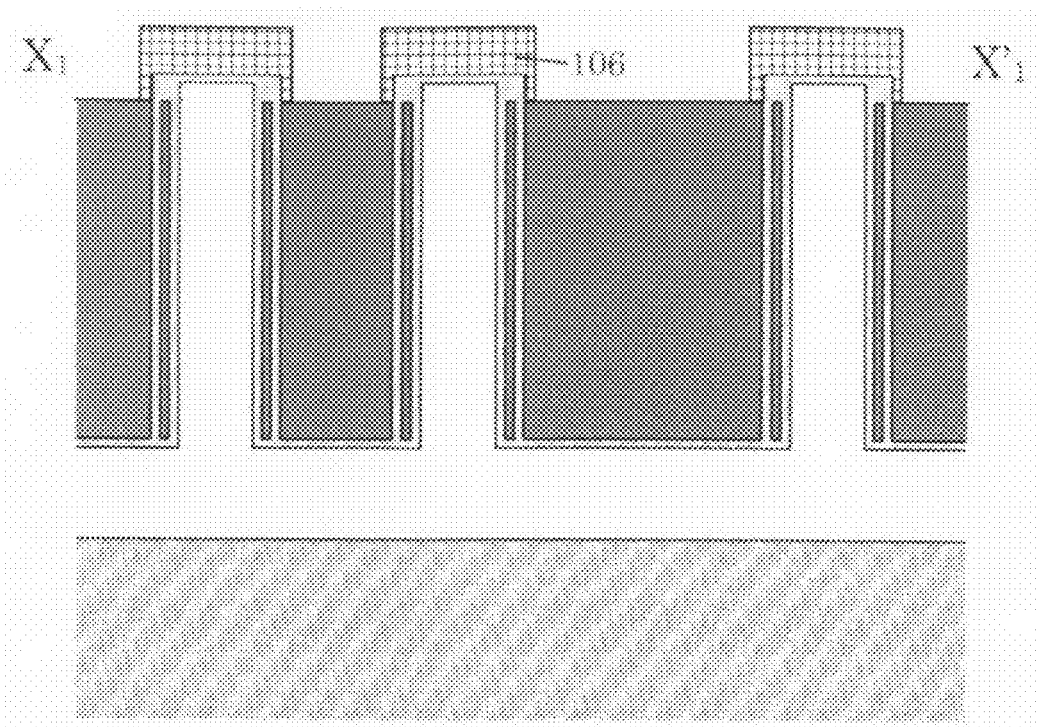
FIG. 39 is a process drawing showing an example of manufacture of the memory cell array taken along the line $X_1$-$X'_1$ according to the present invention.
Figure 40:
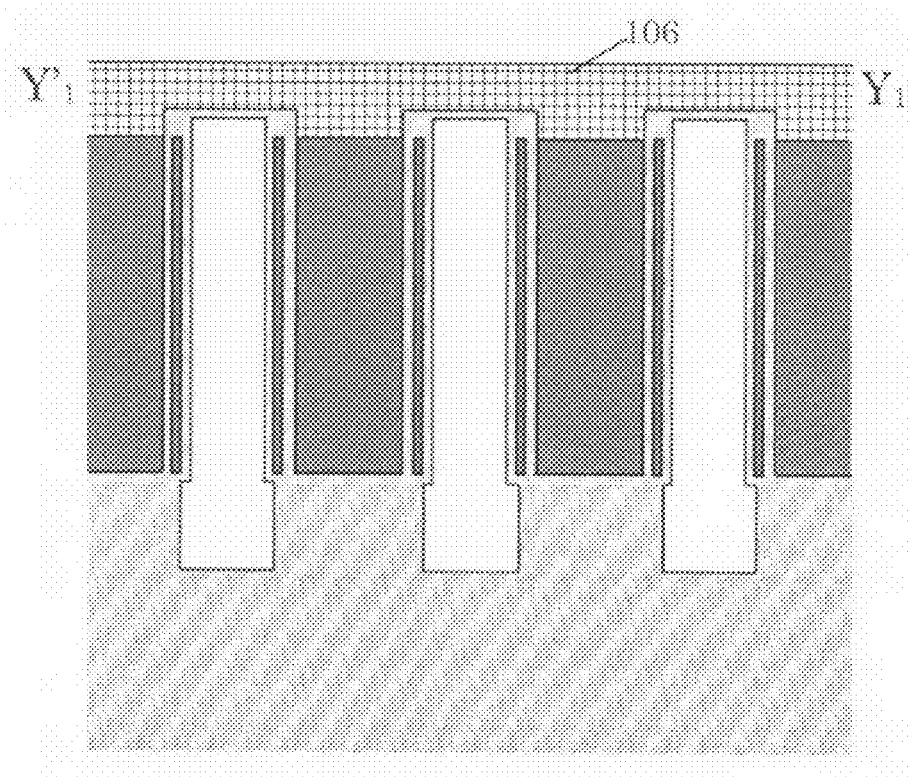
FIG. 40 is a process drawing showing an example of manufacture of the memory cell array taken along the line $Y_1$-$Y'_1$ according to the present invention.
Figure 41:
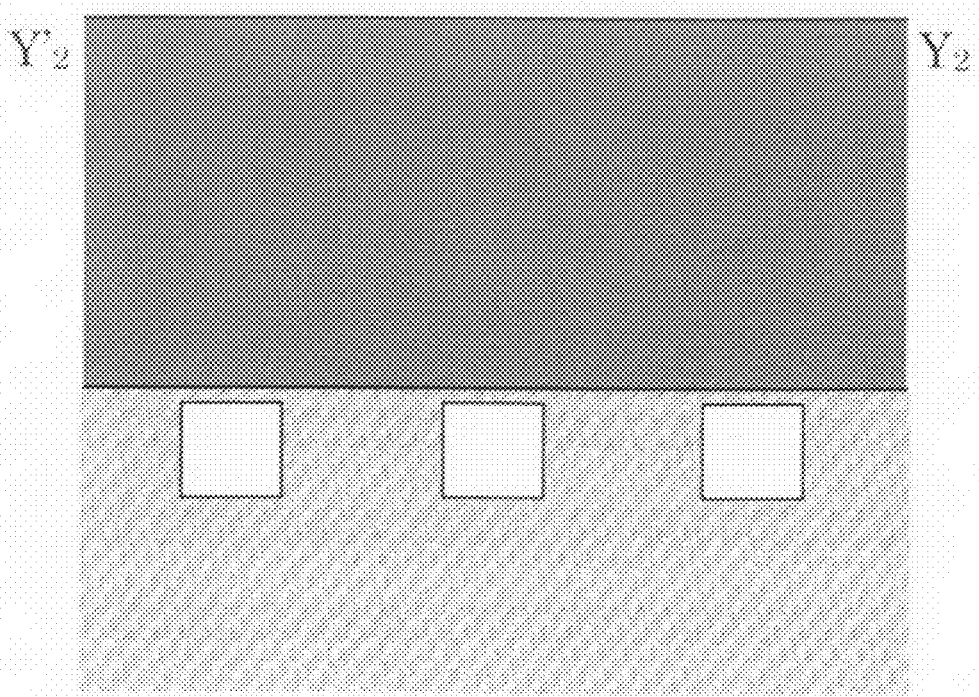
FIG. 41 is a process drawing showing an example of manufacture of the memory cell array taken along the line $Y_2$-$Y'_2$ according to the present invention.

Subsequently, a resist 106 patterned by a lithography technology is formed (FIG. 39 (X1-X'1), FIG. 40 (Y1-Y'1), FIG. 41 (Y2-Y'2)).

Figure 42:
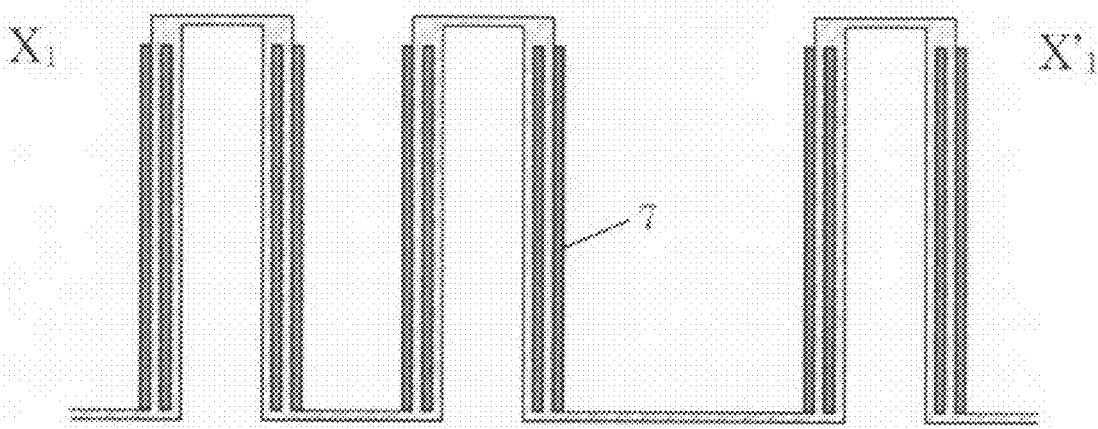
FIG. 42 is a process drawing showing an example of manufacture of the memory cell array taken along the line $X_1$-$X'_1$ according to the present invention.
Figure 43:
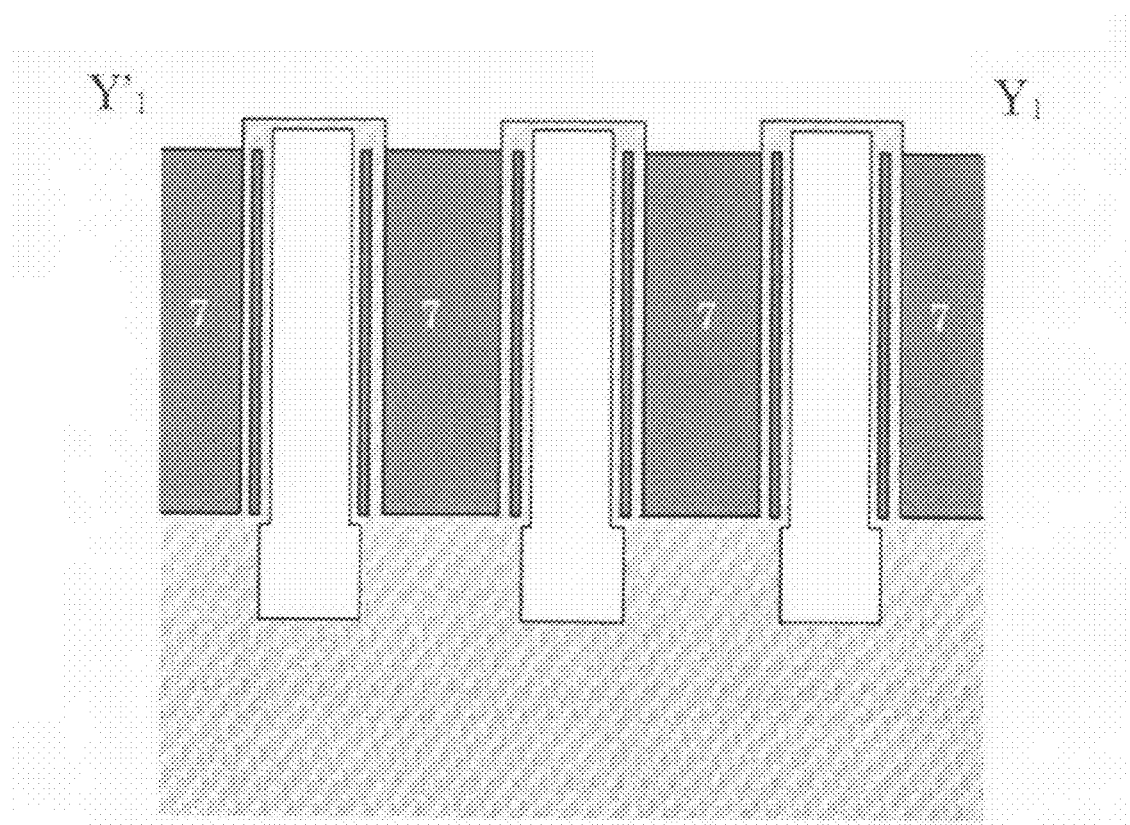
FIG. 43 is a process drawing showing an example of manufacture of the memory cell array taken along the line $Y_1$-$Y'_1$ according to the present invention.
Figure 44:
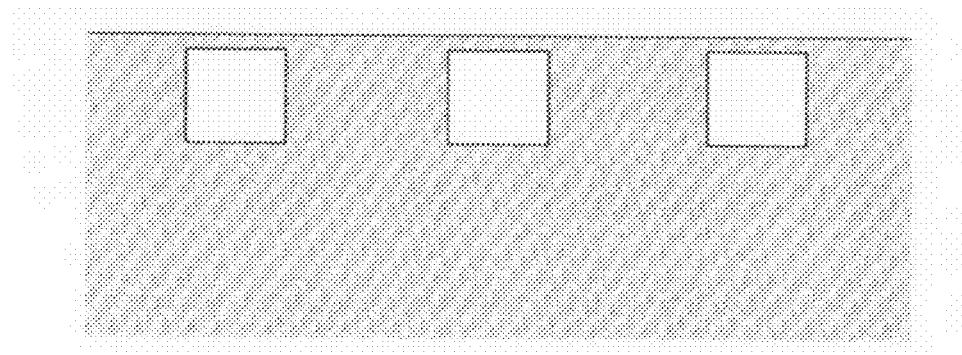
FIG. 44 is a process drawing showing an example of manufacture of the memory cell array taken along the line $Y_2$-$Y'_2$ according to the present invention.

Subsequently, the polycrystal silicon film 105 is etched by the reactive ion etching using the resist as a musk and is made to remain in the shape of the sidewall spacers on the side walls of the charge-storage layers to form the gate lines 7 (FIG. 42 (X1-X'1), FIG. 43 (Y2-Y'2), FIG. 44 (Y2-Y'2)).

Figure 45:
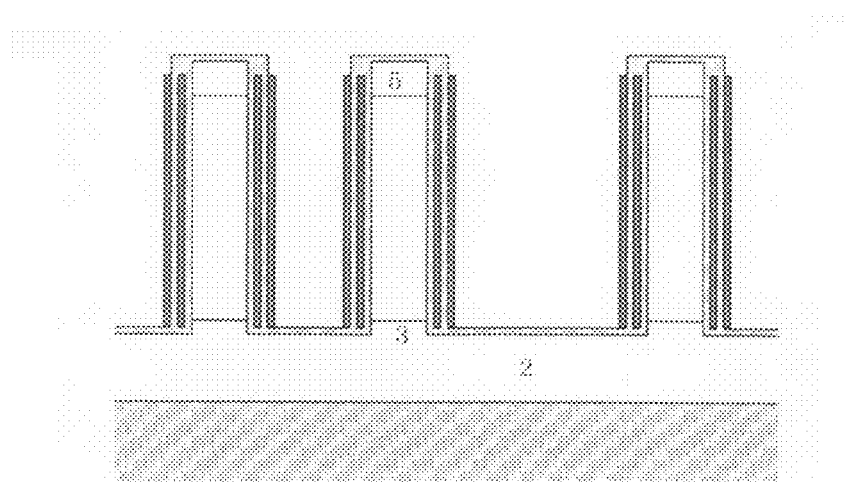
FIG. 45 is a process drawing showing an example of manufacture of the memory cell array taken along the line $X_1$-$X'_1$ according to the present invention.
Figure 46:
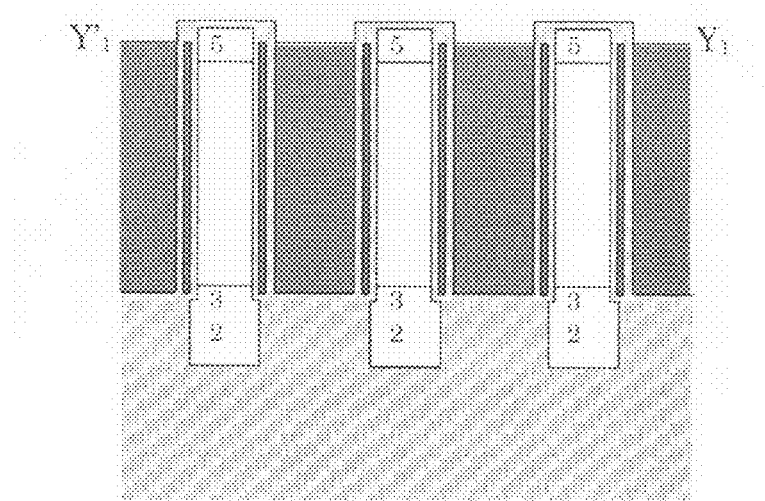
FIG. 46 is a process drawing showing an example of manufacture of the memory cell array taken along the line $Y_1$-$Y'_1$ according to the present invention.
Figure 47:
FIG. 47 is a process drawing showing an example of manufacture of the memory cell array taken along the line $Y_2$-$Y'_2$ according to the present invention.

Subsequently, the first source lines 2, the source diffusion layers 3, and the drain diffusion layers 5 are formed by the ion injecting method of the like (FIG. 45 (X1-X'1), FIG. 46 (Y1-Y'1), FIG. 47 (Y2-Y'2)).

Figure 48:
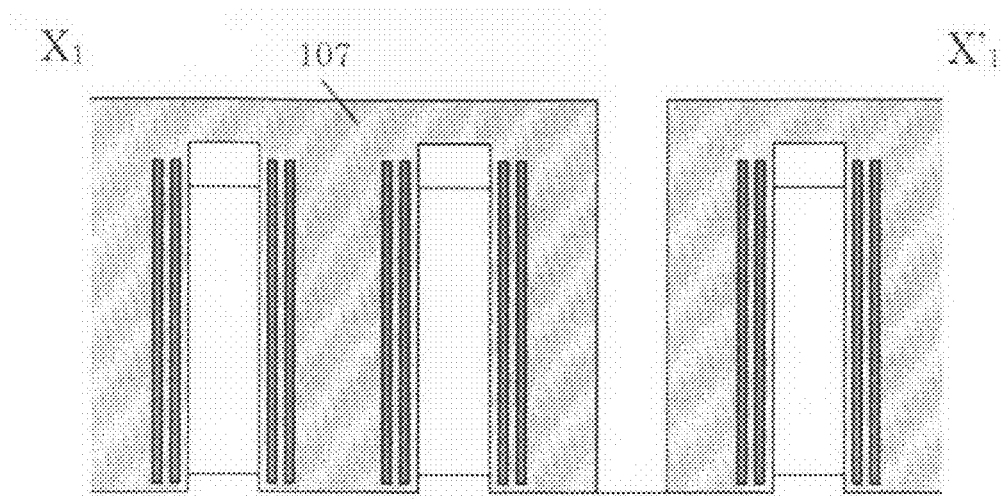
FIG. 48 is a process drawing showing an example of manufacture of the memory cell array taken along the line $X_1$-$X'_1$ according to the present invention.
Figure 49:
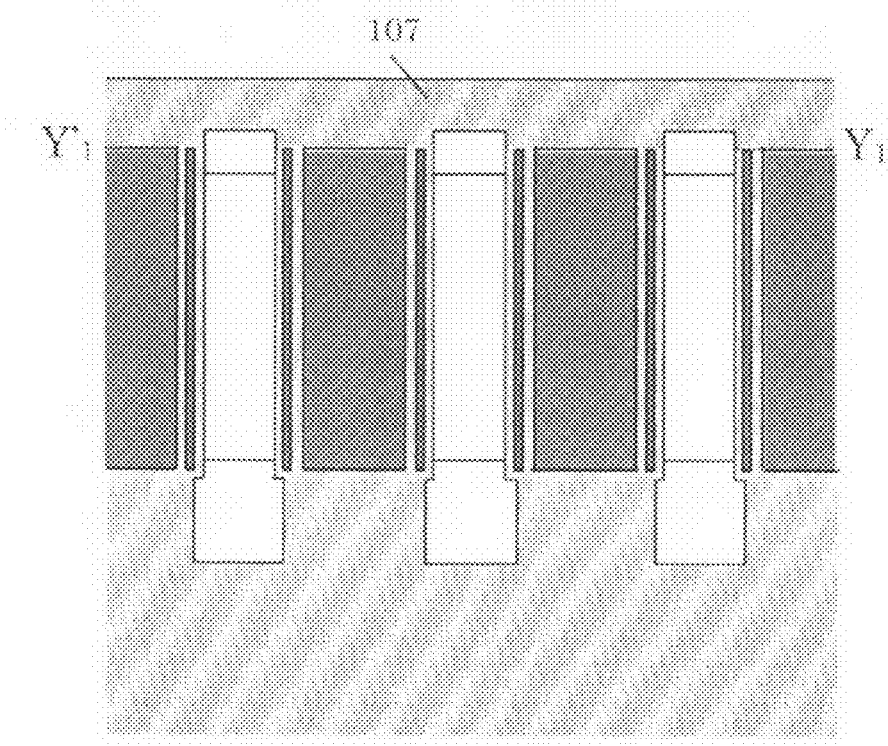
FIG. 49 is a process drawing showing an example of manufacture of the memory cell array taken along the line $Y_1$-$Y'_1$ according to the present invention.
Figure 50:
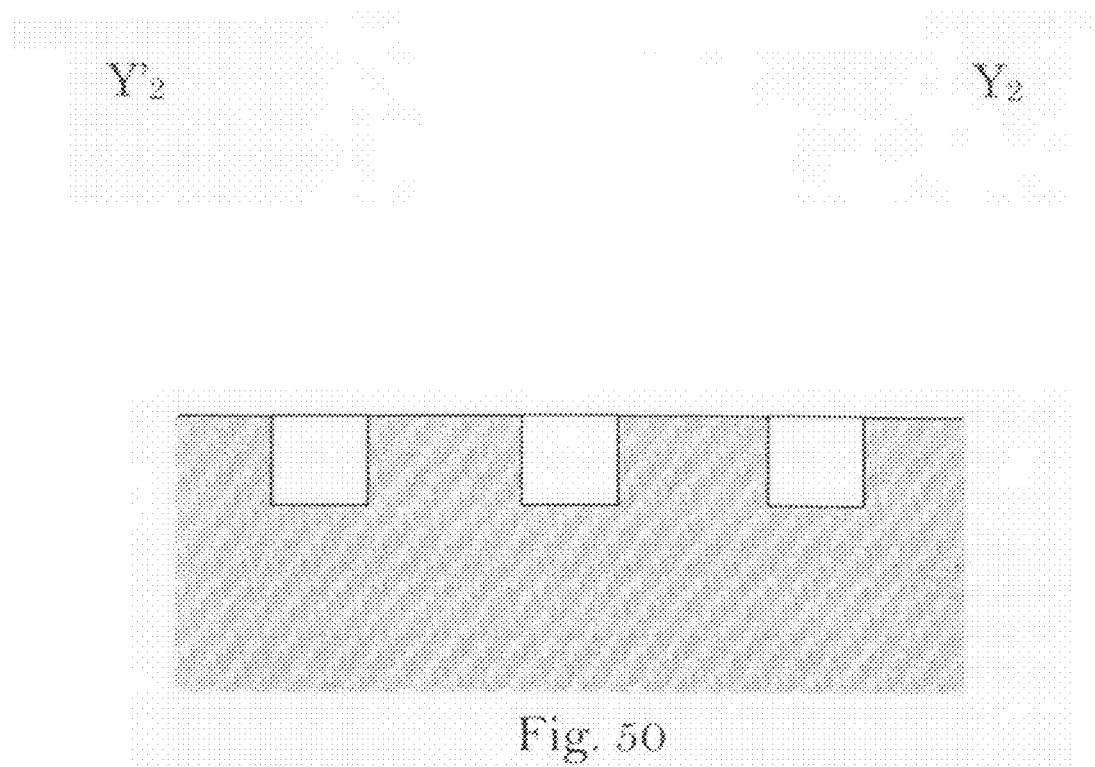
FIG. 50 is a process drawing showing an example of manufacture of the memory cell array taken along the line $Y_2$-$Y'_2$ according to the present invention.

Subsequently, an inter-layer insulating film 107 such as a silicon oxide film is accumulated and is flattened using the CMP or the like, and the inter-layer insulating film is etched by the reactive ion etching using the resist as a musk (FIG. 48 (X1-X'1), FIG. 49 (Y1-Y'1), FIG. 50 (Y2-Y'2)).

Figure 51:
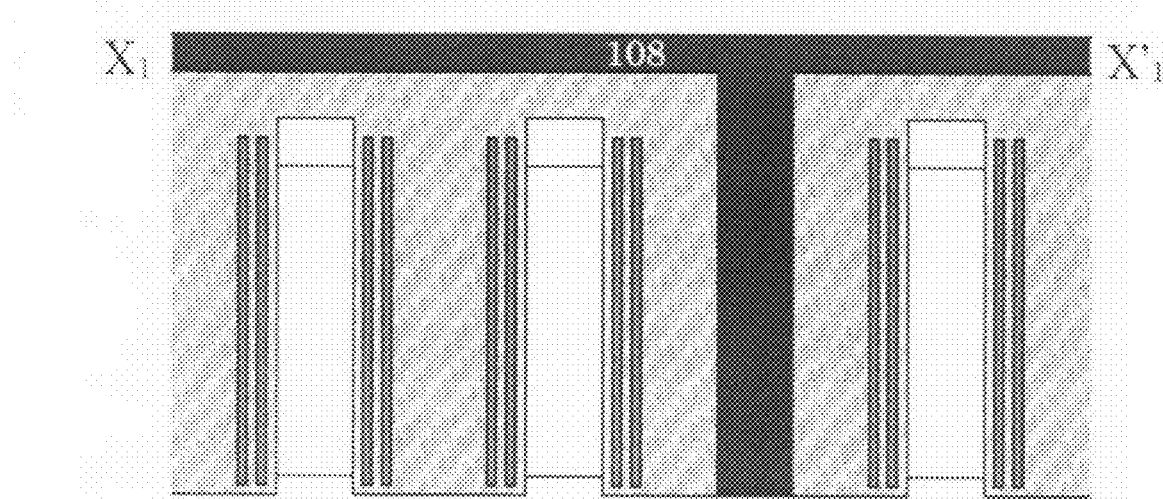
FIG. 51 is a process drawing showing an example of manufacture of the memory cell array taken along the line $X_1$-$X'_1$ according to the present invention.
Figure 52:
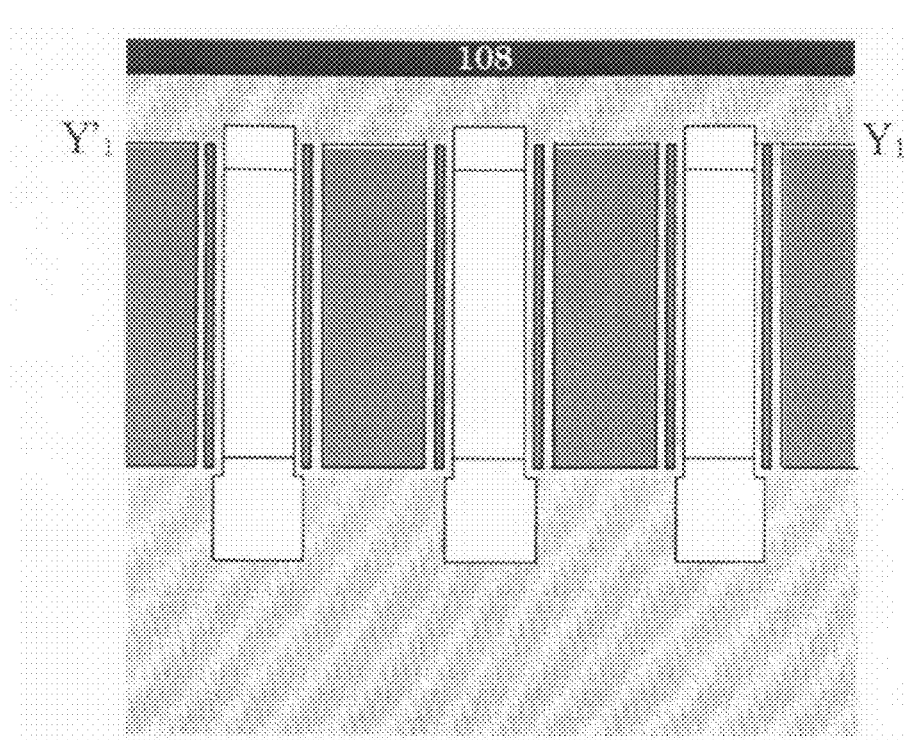
FIG. 52 is a process drawing showing an example of manufacture of the memory cell array taken along the line $Y_1$-$Y'_1$ according to the present invention.
Figure 53:
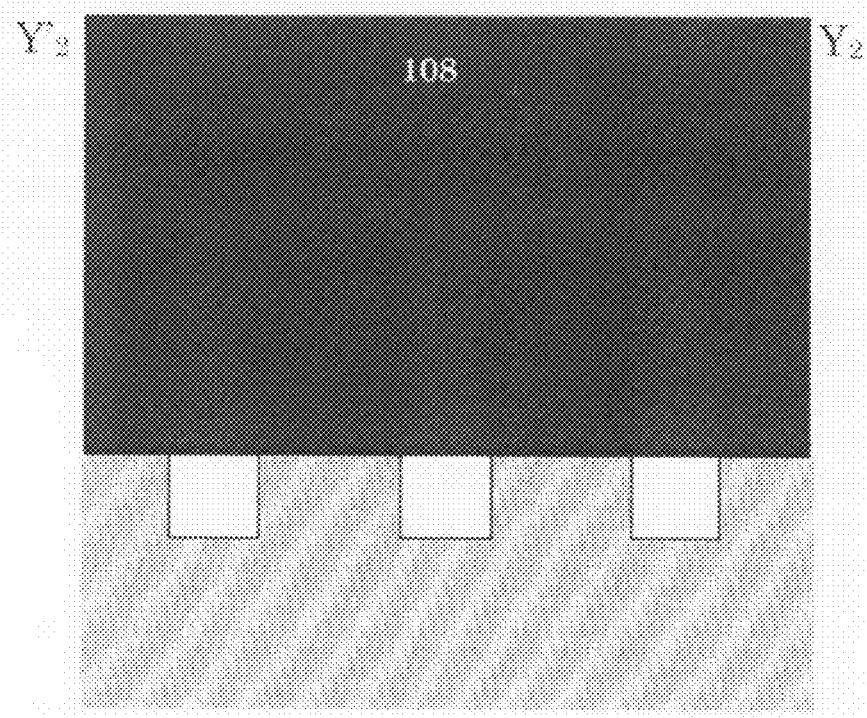
FIG. 53 is a process drawing showing an example of manufacture of the memory cell array taken along the line $Y_2$-$Y'_2$ according to the present invention.

Subsequently, a metal 108 is accumulated by spattering or the like (FIG. 51 (X1-X'1), FIG. 52 (Y1-Y'1), FIG. 53 (Y2-Y'2)).

Figure 54:
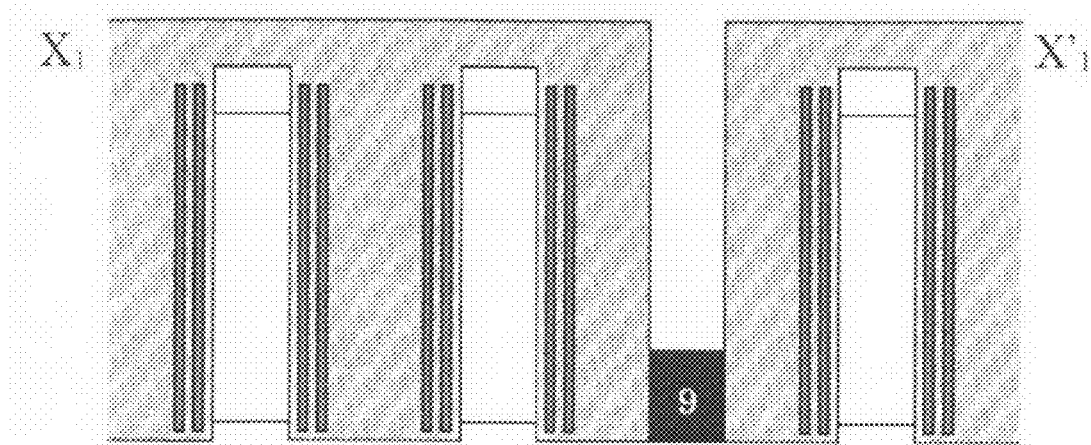
FIG. 54 is a process drawing showing an example of manufacture of the memory cell array taken along the line $X_1$-$X'_1$ according to the present invention.
Figure 55:
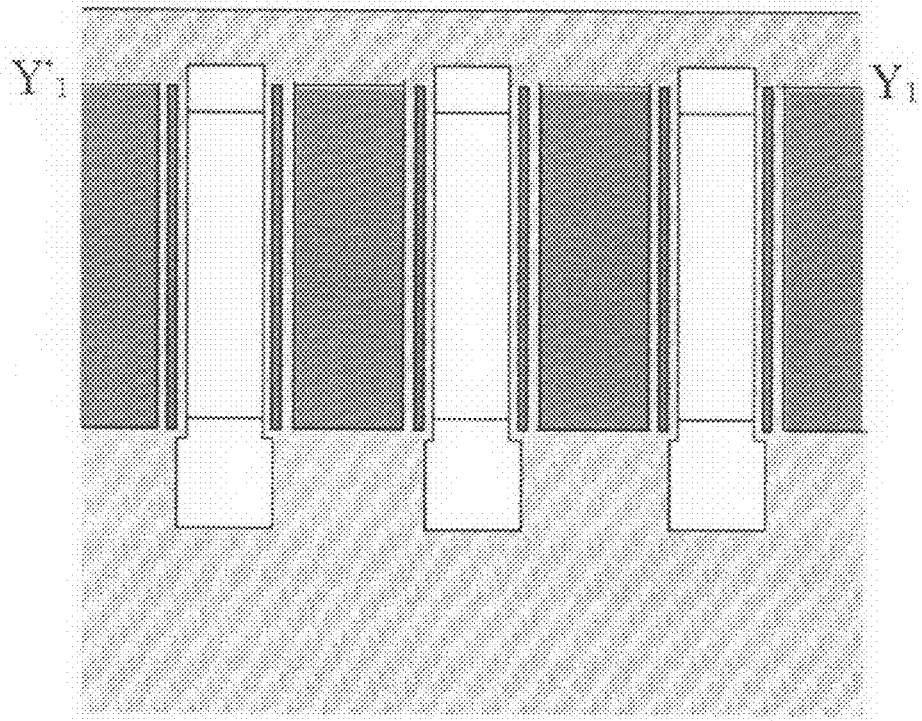
FIG. 55 is a process drawing showing an example of manufacture of the memory cell array taken along the line $Y_1$-$Y'_1$ according to the present invention.
Figure 56:
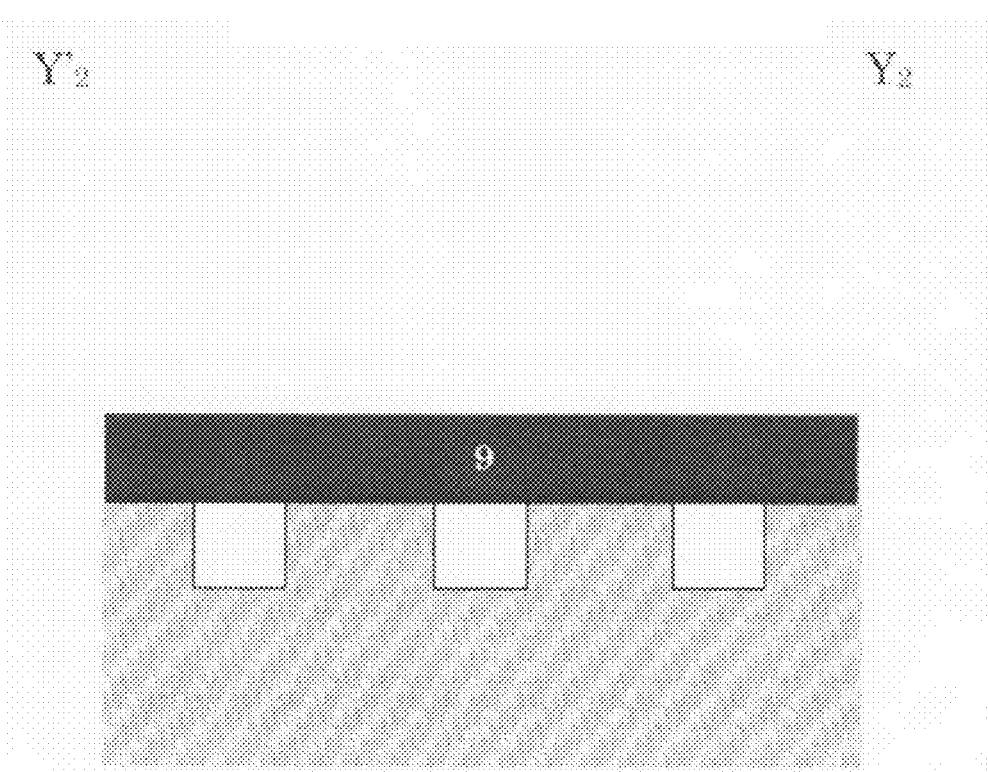
FIG. 56 is a process drawing showing an example of manufacture of the memory cell array taken along the line $Y_2$-$Y'_2$ according to the present invention.

Subsequently, the metal is etched by the reactive ion etching to form the second source lines 9 (FIG. 54 (X1-X'1), FIG. 55 (Y1-Y'1), and FIG. 56 (Y2-Y'2)).

Figure 57:
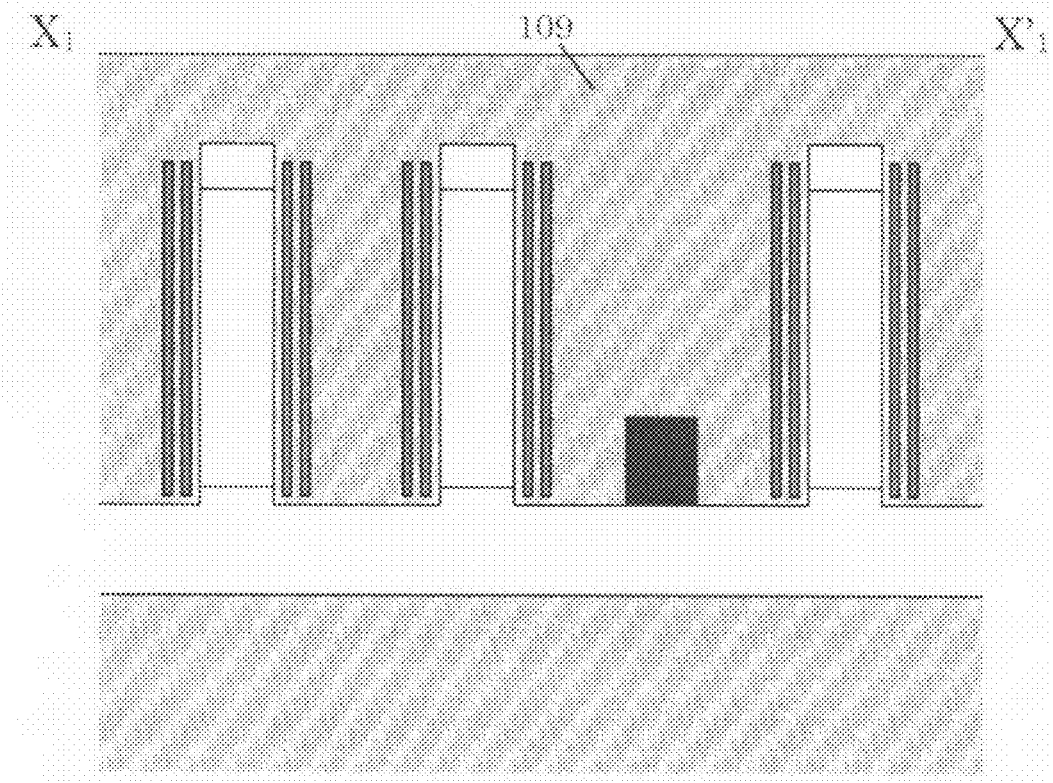
FIG. 57 is a process drawing showing an example of manufacture of the memory cell array taken along the line $X_1$-$X'_1$ according to the present invention.
Figure 58:
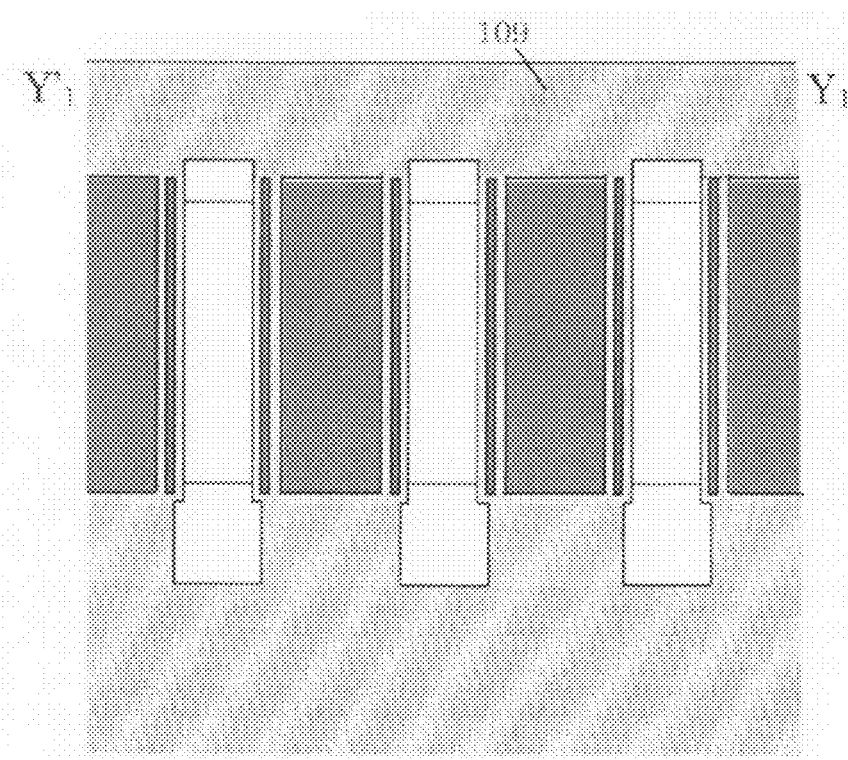
FIG. 58 is a process drawing showing an example of manufacture of the memory cell array taken along the line $Y_1$-$Y'_1$ according to the present invention.
Figure 59:
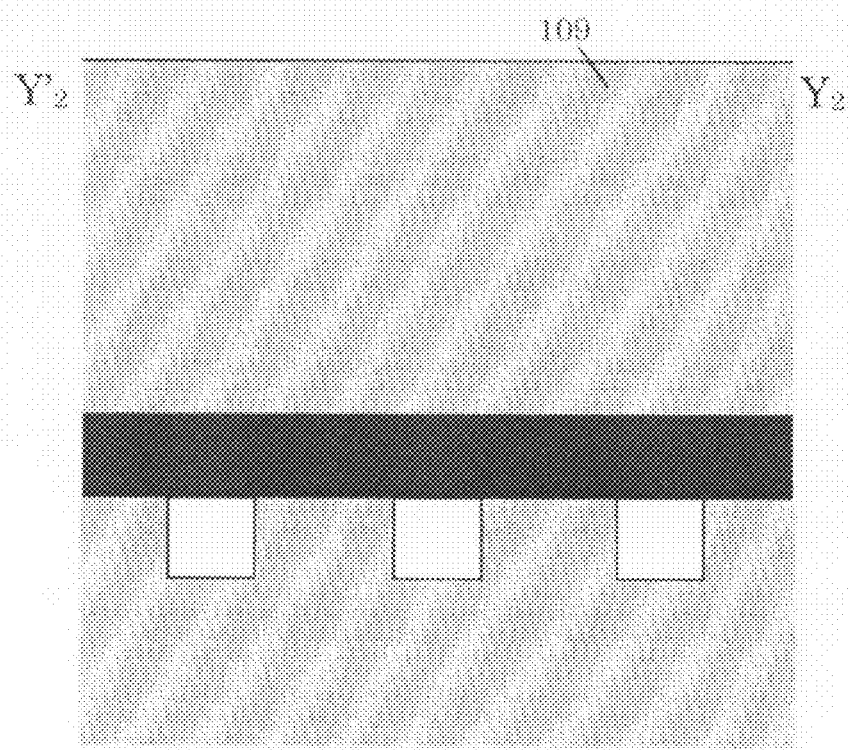
FIG. 59 is a process drawing showing an example of manufacture of the memory cell array taken along the line $Y_2$-$Y'_2$ according to the present invention.

Subsequently, an inter-layer insulating film 109 is accumulated (FIG. 57 (X1-X'1), FIG. 58 ($Y_1$-Y'1), FIG. 59 (Y2-Y'2)).

Figure 60:
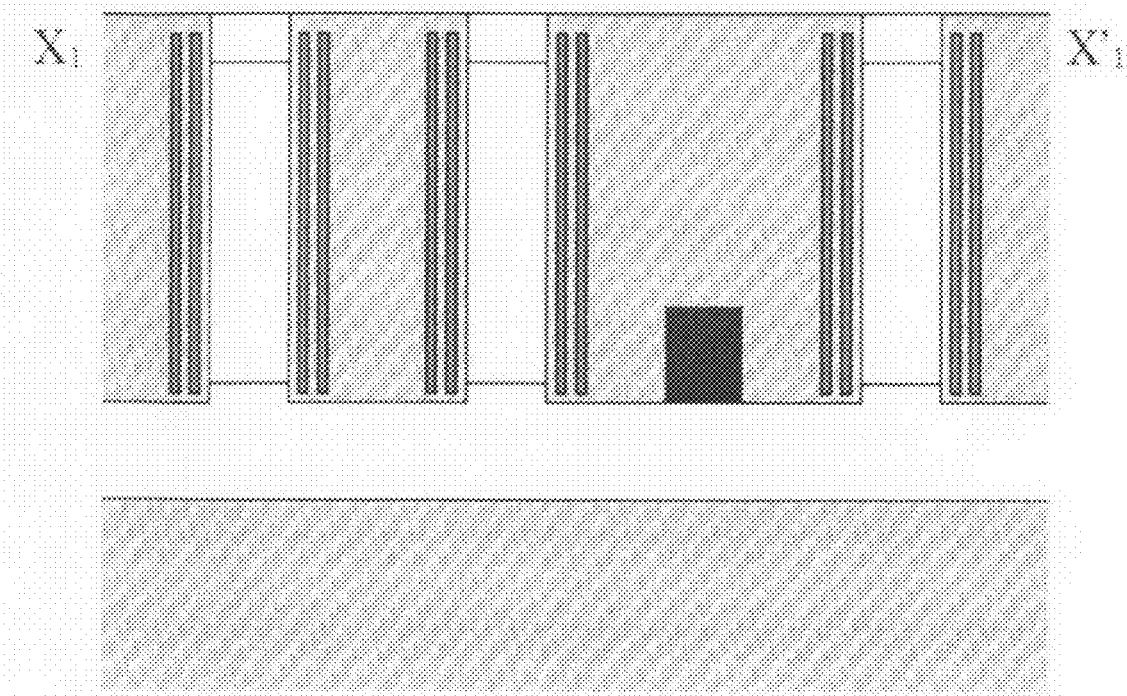
FIG. 60 is a process drawing showing an example of manufacture of the memory cell array taken along the line $X_1$-$X'_1$ according to the present invention.
Figure 61:
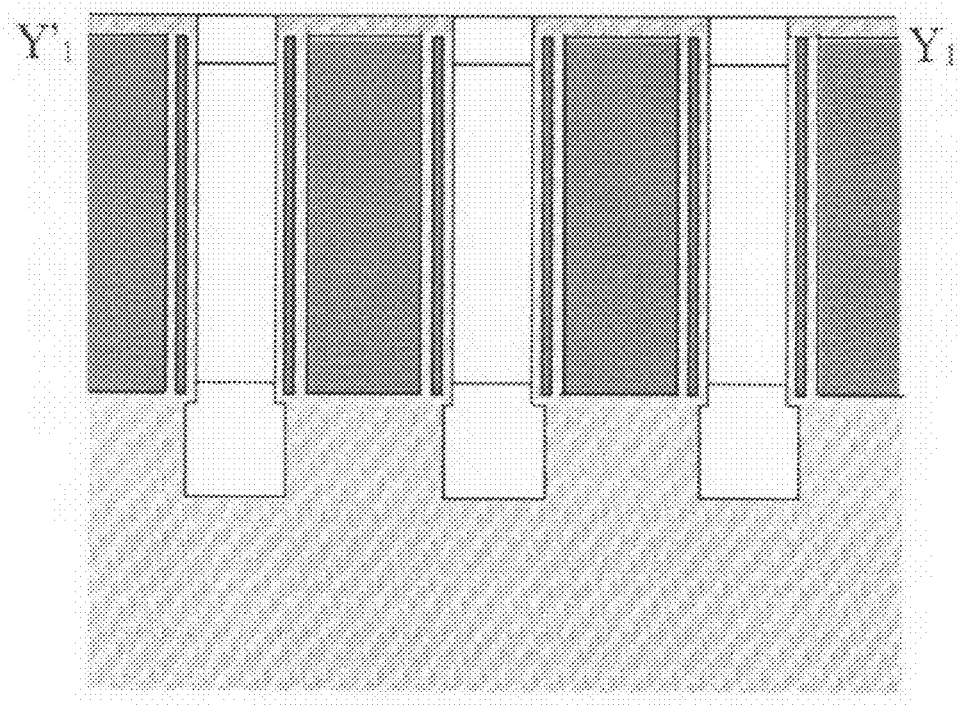
FIG. 61 is a process drawing showing an example of manufacture of the memory cell array taken along the line $Y_1$-$Y'_1$ according to the present invention.
Figure 62:
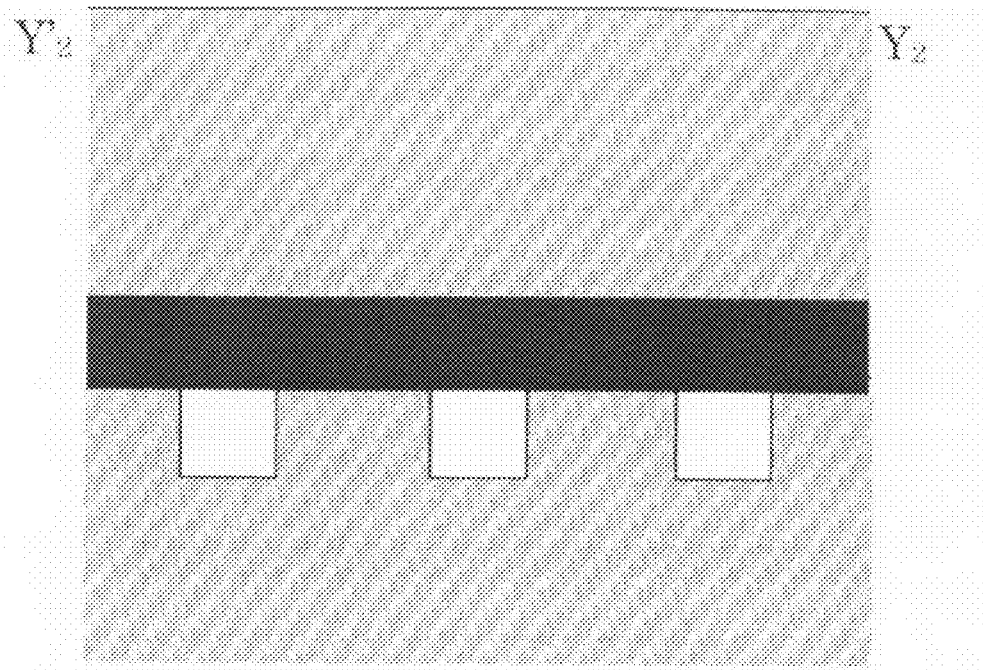
FIG. 62 is a process drawing showing an example of manufacture of the memory cell array taken along the line $Y_2$-$Y'_2$ according to the present invention.

Subsequently, the drain diffusion layers are exposed by using the CMP or the like (FIG. 60 (X1-X'1), FIG. 61 (Y1-Y'1), FIG. 62 (Y2-Y'2)).

Figure 63:
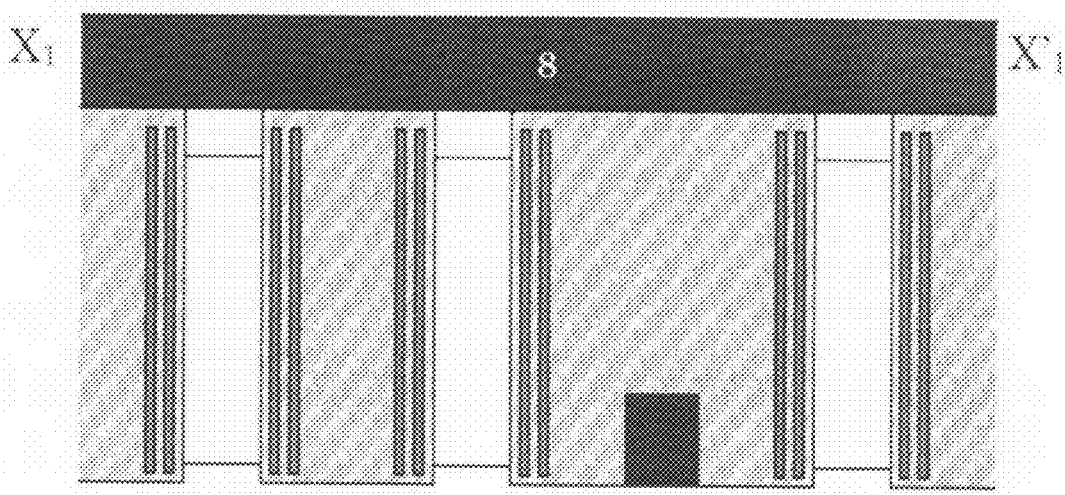
FIG. 63 is a process drawing showing an example of manufacture of the memory cell array taken along the line $X_1$-$X'_1$ according to the present invention.
Figure 64:
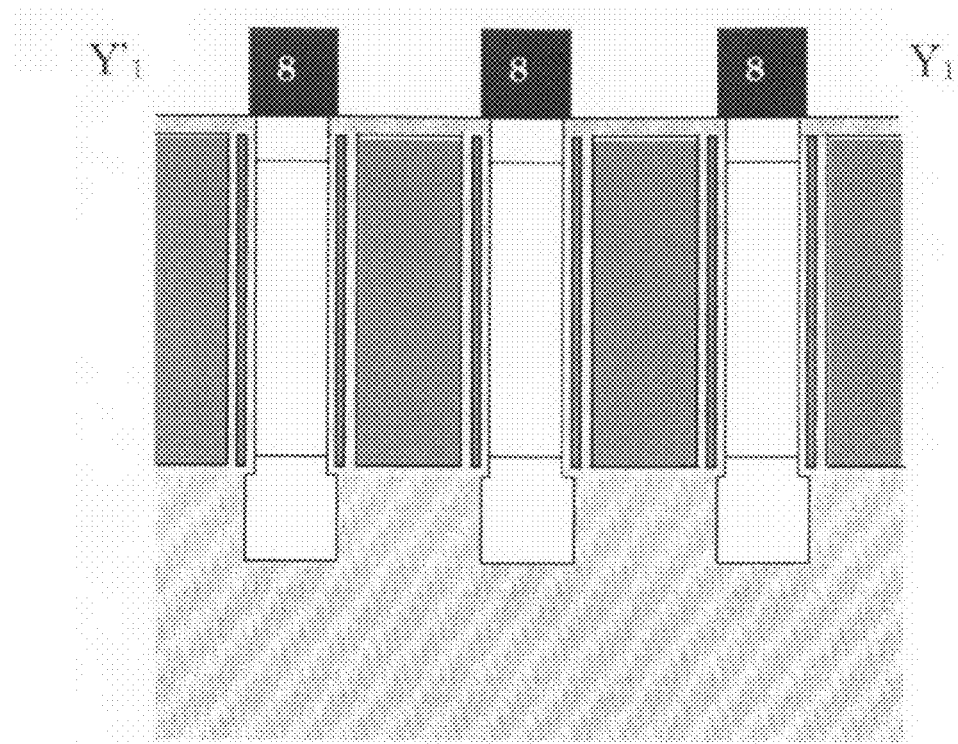
FIG. 64 is a process drawing showing an example of manufacture of the memory cell array taken along the line $Y_1$-$Y'_1$ according to the present invention.

Subsequently, the metal is accumulated by spattering or the like and the metal is etched using the resist as a mask to form the bit lines 8 (FIG. 63 (X1-X'1), FIG. 64 (Y1-Y'1), FIG. 65 (Y2-Y'2)).

Referring now to FIG. 66 to FIG. 69, a method of driving the nonvolatile semiconductor memory cell array of the present invention will be described.

Figure 66:
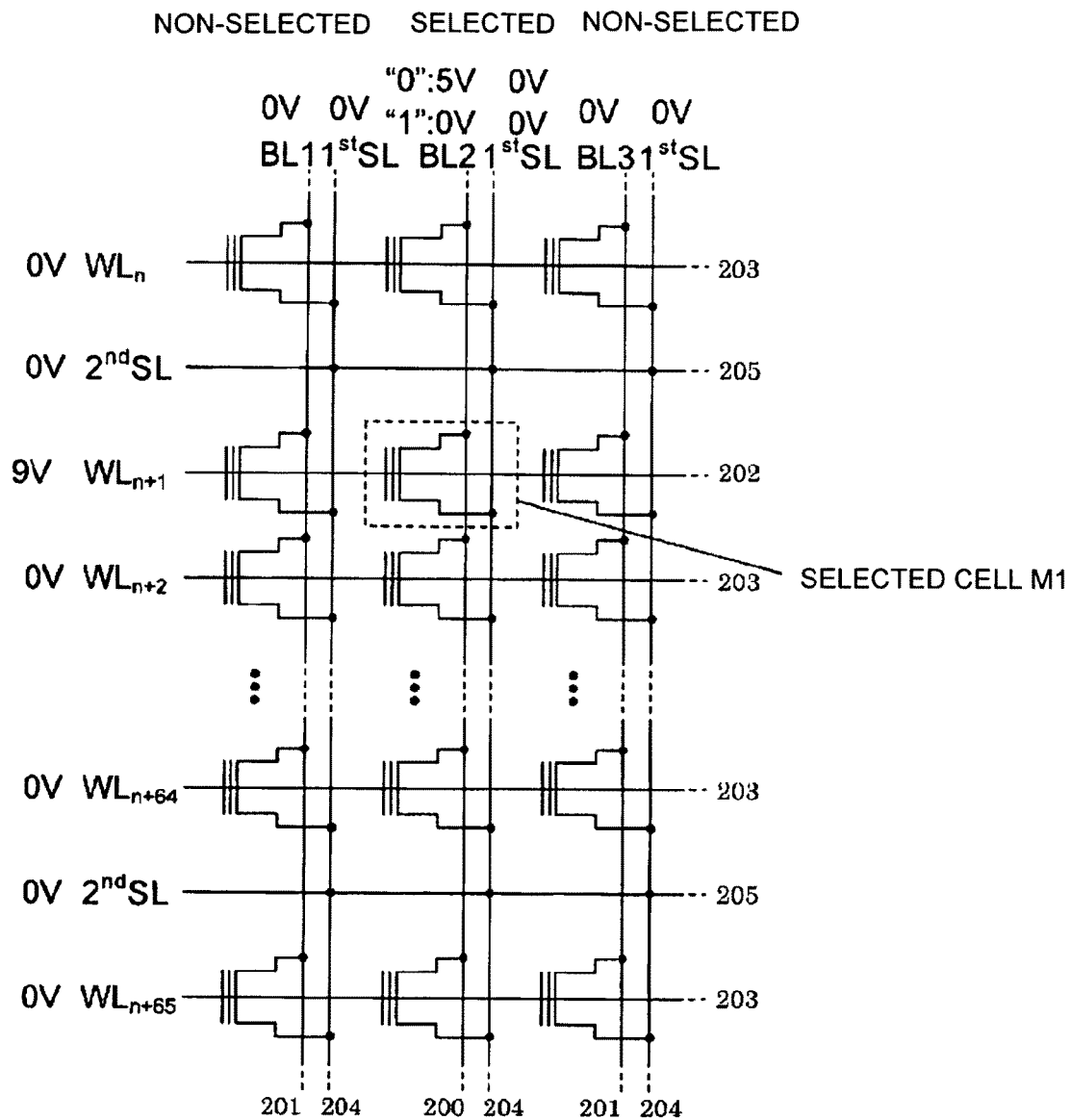
FIG. 66 is a drawing showing a relation of potential at the time of data writing.

The operation to inject (write) electric charge to the charge-storage layer of a selected memory cell M1 by the hot electrons is performed as shown in FIG. 66. A voltage of 0V or a voltage to an extent which generates hot electrons (5V) is applied to a selected bit line 200, a voltage of 0V is applied to non-selected bit lines 201, a high-voltage (9V) is applied to a selected gate line 202, a voltage of 0V is applied to non-selected gate lines 203, and a voltage of 0V is applied to a first source line 204 and second first source lines 205. In the operation described above, the electric charge is injected to the charge-storage layer using the hot electrons.

Figure 67:
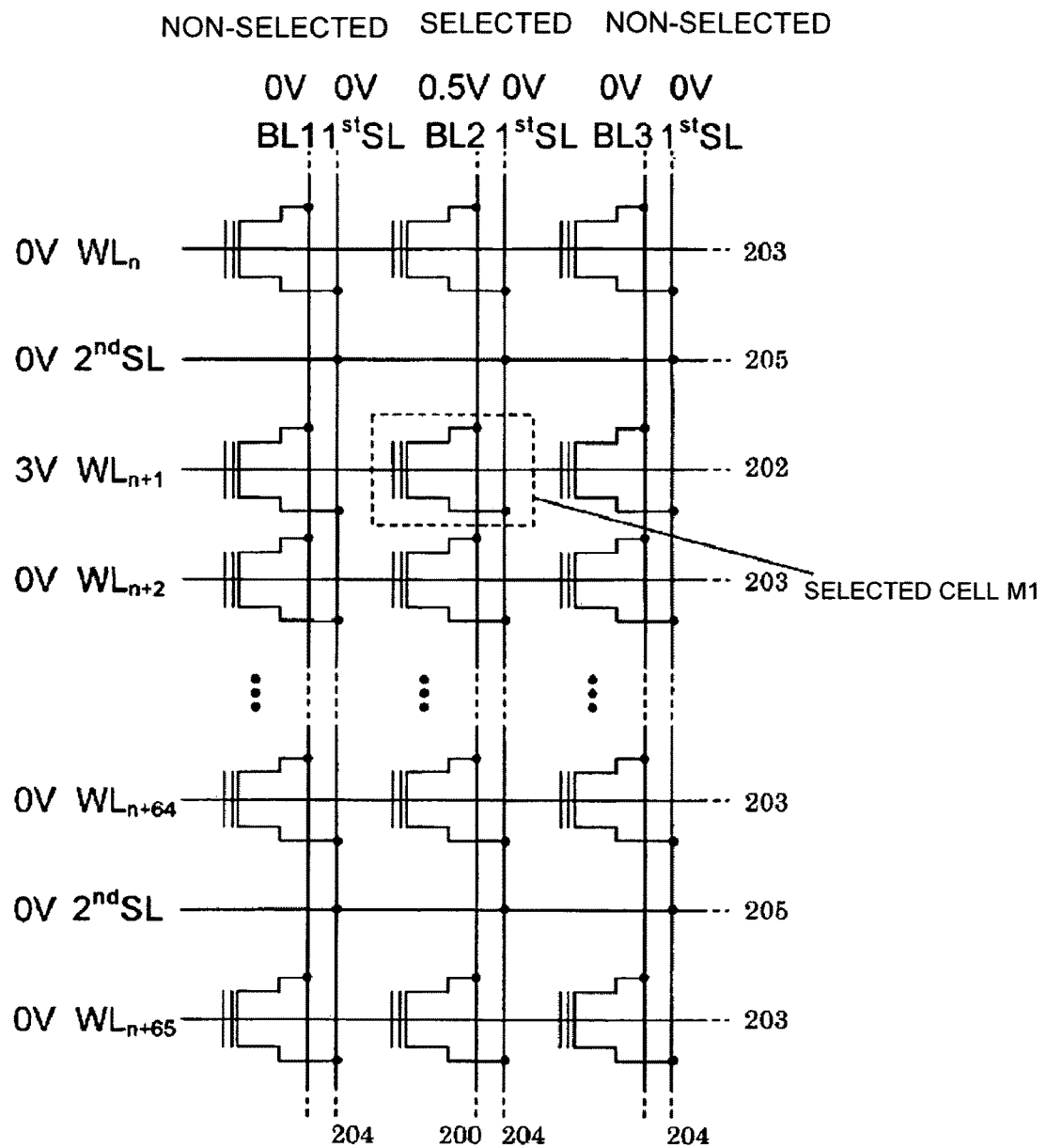
FIG. 67 is a drawing showing a relation of potential at the time of reading data.

The reading operation of data in the selected memory cell M1 is performed as shown in FIG. 67. A voltage (3V) is applied to the selected gate line 202, a voltage of 0V is applied to the non-selected gate lines 203, a voltage of 0V is applied to the first source lines 204 and the second first source lines 205, and a voltage (0.5V) is applied to the selected bit lines 200, so that the selected memory cell can be read out.

Figure 68:
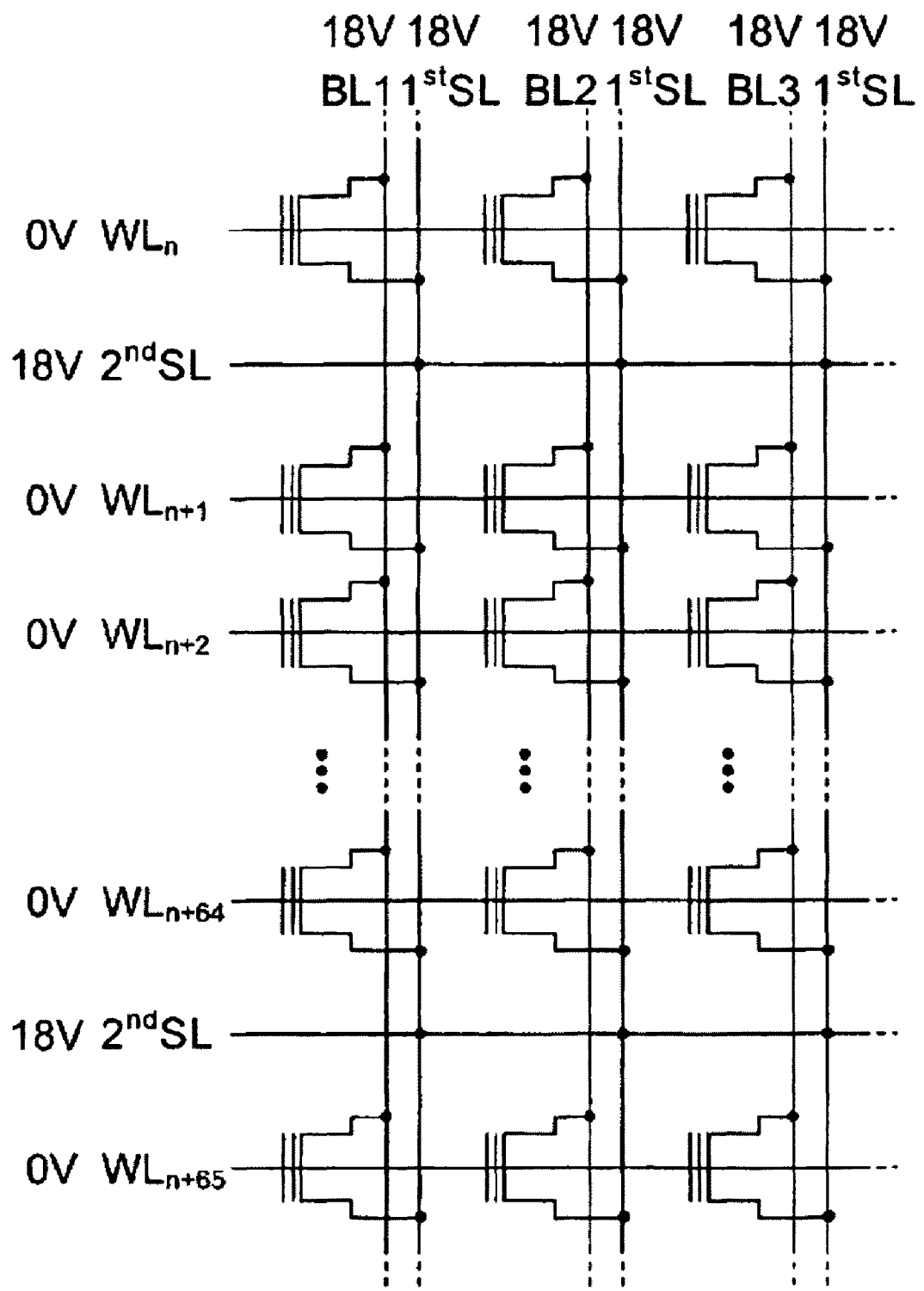
FIG. 68 is a drawing showing a relation of potential at the time of deleting all memory cells.

The operation to discharge the electric charge from the charge-storage layer of all the memory cells in the memory cell array by the FN tunnel current (deleting operation) is performed as shown in FIG. 68. A deleting voltage (18V) is applied to all the bit lines, all the first source lines, and the second source lines, and a voltage of 0V is applied to all the gate lines, so that the electric charges can be discharged from the charge-storage layer of all the memory cells using the FN tunnel current.

Figure 69:
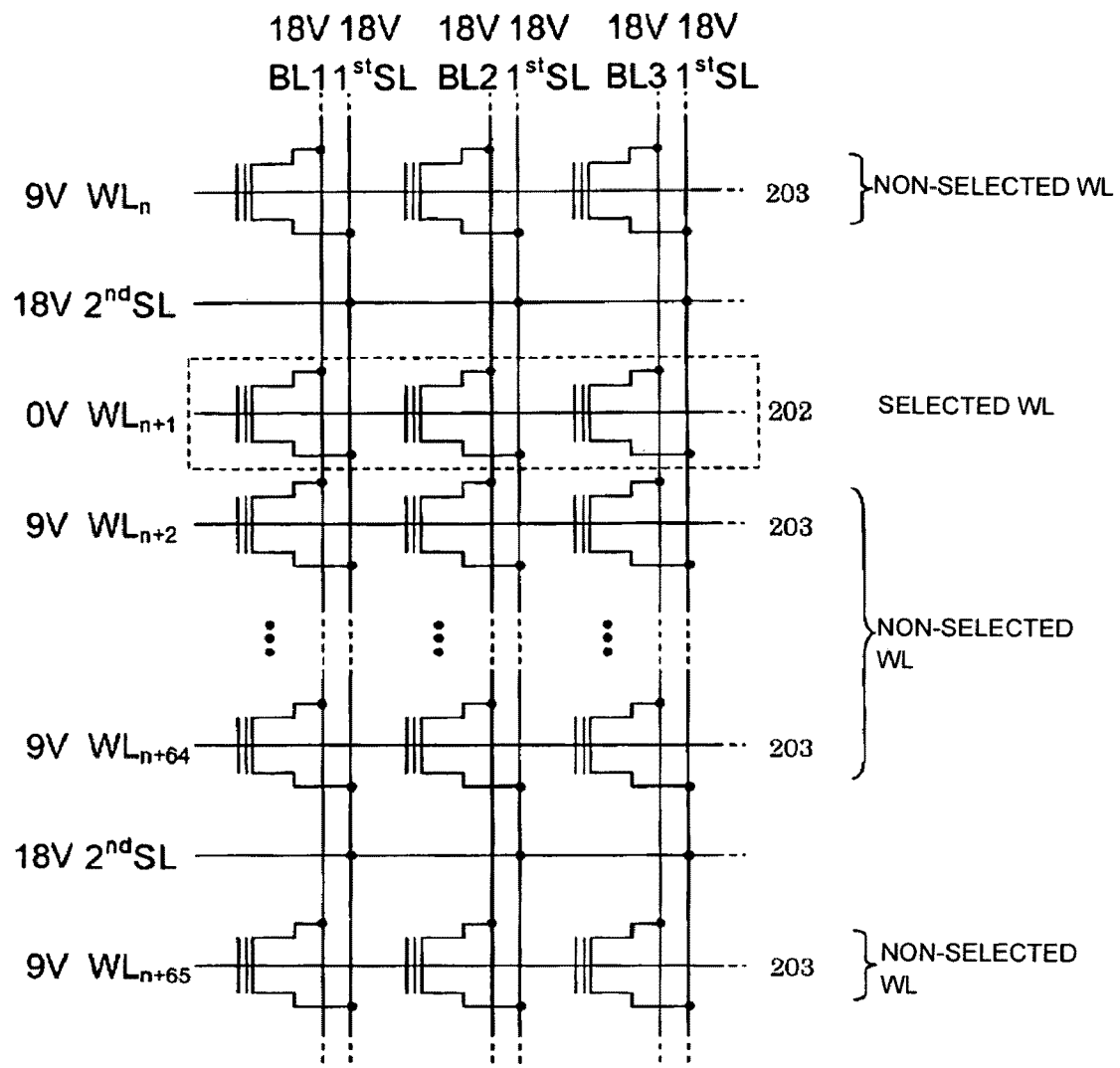
FIG. 69 is a drawing showing a relation of potential at the time of deleting all the memory cells connected to a selected gate line.

The operation to discharge the electric charge from the charge-storage layer of the memory cells connected to the selected gate line of the memory cell array by the FN tunnel current (deleting operation) is performed as shown in FIG. 69. A deleting voltage (18V) is applied to all the bit lines, the first source lines, and the second source lines, a voltage of 0V is applied to the selected gate line 202, and a voltage to an extant which can prevent deleting is applied to the non-selected gate lines 203, so that the electric charges can be discharged from the charge-storage layer of the memory cells connected to the selected gate line using the FN tunnel current.

Figure 70:
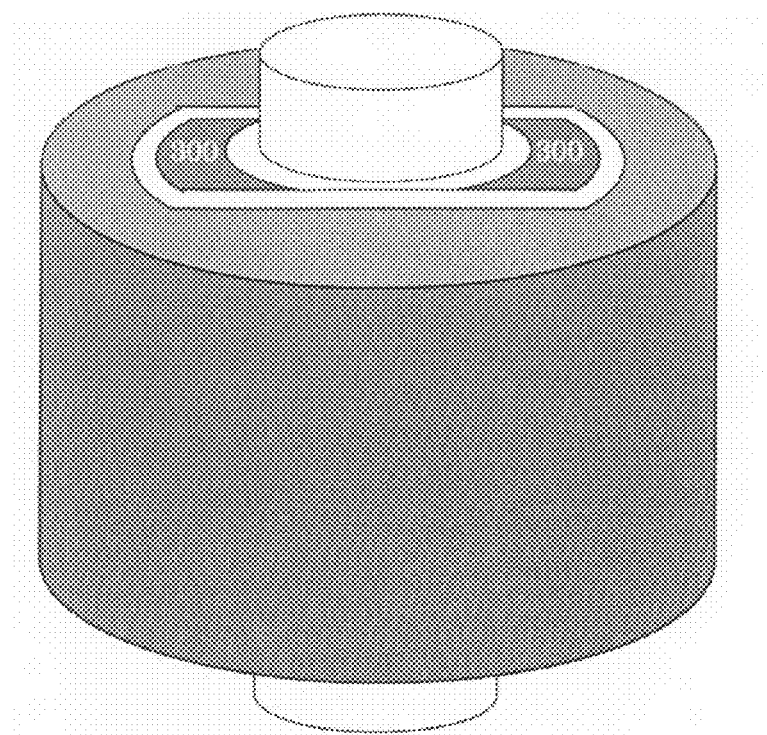
FIG. 70 is an air view showing another embodiment of the present invention.
Figure 71:
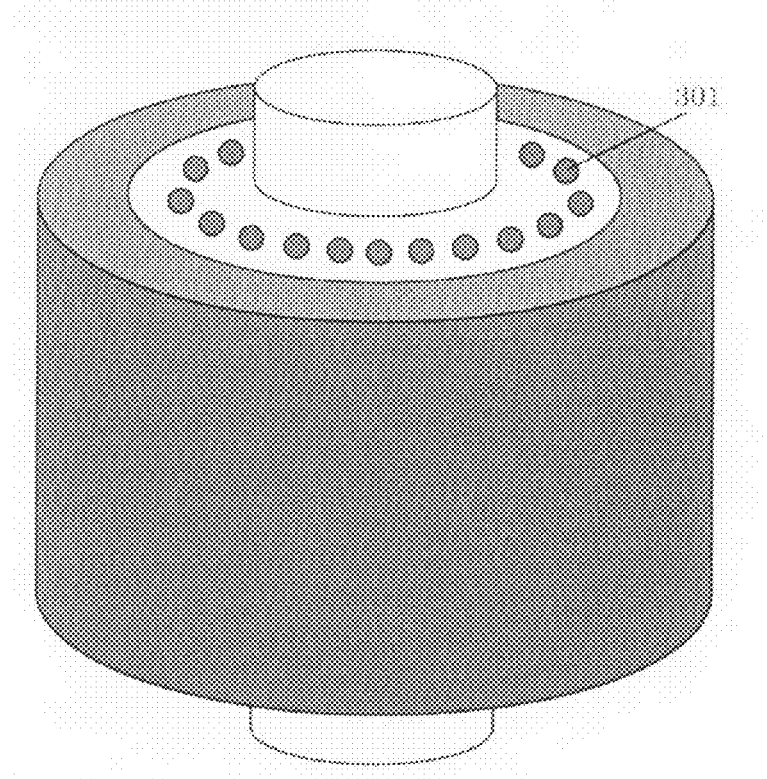
FIG. 71 is an air view showing the another embodiment of the present invention.
Figure 72:
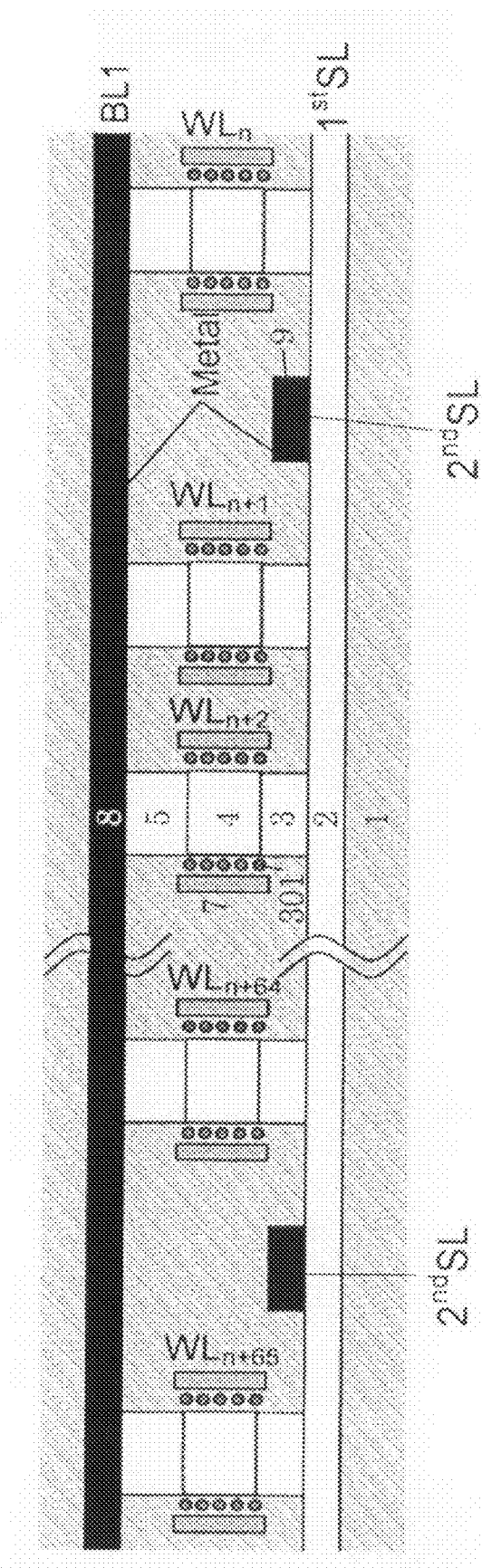
FIG. 72 is a cross-sectional view showing the another embodiment of the present invention.

In the example, the memory cells each having a structure of a single charge-storage layer surrounding the island semiconductor via the gate insulating film on the channel area on the side wall interposed between the drain diffusing layer and the source diffusing layer of the island semiconductor layer is used. However, the charge-storage layer does not necessarily have to be a single charge-storage layer, and part of the channel area on the side wall of the island semiconductor may be surrounded by one or a plurality of charge-storage layers 300 as shown in FIG. 70. Alternatively, a nonvolatile semiconductor memory cell (FIG. 71) having a structure of being writable using one or a plurality of molecular charge-storage layers 301 or hot electrons having charge storable areas may be provided between the control gate and the island semiconductor layer (FIG. 72).

As described above, according to the present invention, since the second source lines formed of metal are provided at every predetermined of number of gate lines, reduction of the resistance of the source lines is achieved, application of a voltage of 0V to the source diffusion layers of the memory cells is achieved at the time of writing, application of a sufficient voltage between the source and the drain is achieved, and flowing of a sufficient current between the source and the drain is achieved, so that the lowering of the writing speed can be avoided. At the time of reading as well, application of a voltage of 0V to the source diffusion layers of the memory cells is achieved, and application of a sufficient voltage between the source and the drain is achieved, so that the lowering of the reading speed can be avoided.

What is claimed is:

1. A nonvolatile semiconductor memory including a plurality of memory cells each comprising:
    a source area, a channel area, and a drain area thereon in this order extending from a surface of a substrate and in a direction perpendicular to the surface of the substrate, and further having a charge-storage layer on an outside surface of the channel area via a gate insulating film, and a control gate on an outside surface of the charge-storage layer so as to cover the charge-storage layer via an insulating layer, the memory cells arranged in a matrix of n rows and m columns on the substrate and further comprising:
    a plurality of first source lines arranged in a column direction and connecting the source areas of the memory cells with respect to each other;
    a plurality of parallel bit lines arranged in the column direction and connecting the drain areas with respect to each other on a layer different from the first source line;
    a plurality of gate lines arranged in a row direction substantially orthogonal to the column direction and connecting the control gates with respect to each other; and
    second source lines arranged one each at every p rows (p<n) of the matrix and comprising a metal and connecting the first source lines with respect to each other.

2. A nonvolatile semiconductor memory including a plurality of memory cells each comprising:
    a source area, a channel area, and a drain area thereon in this order extending from a surface of a substrate and in a direction perpendicular to surface of the substrate, and further having a charge-storage layer on the outside of the channel area via a gate insulating film, and a control gate on the outside of the charge-storage layer so as to cover the charge-storage layer via an insulating layer, the memory cells arranged in a matrix of n rows and m columns on the substrate and further comprising:
    a first common diffusion source line arranged so as to connect source areas of the memory cells arranged respectively in a row direction and a column direction of the matrix with respect to each other;
    a plurality of parallel bit lines arranged in the column direction and connecting the drain areas of the memory cells on a layer different from the first common diffusion source line with respect to each other;
    a plurality of gate lines arranged in the row direction substantially orthogonal to the column direction and connecting the control gates of the memory cells with respect to each other; and
    second source lines comprising a metal and connected to the first common diffusion source line and arranged one each at every p rows (p<n) of the matrix.

3. A method of writing to the nonvolatile semiconductor memory according to claim 1 by injecting an electric charge into the charge-storage layer of a selected memory cell using hot electron injection, the method comprising:
    applying a first voltage of 0V or a positive value to a selected bit line;
    applying a voltage of 0V to non-selected bit lines;
    applying a second voltage of a positive value to a selected gate line;
    applying a voltage of 0V to non-selected gate lines; and
    applying a voltage of 0V to a first source line or a first common diffusion source line and to the second source lines.

4. A method of reading from the nonvolatile semiconductor memory according to claim 1 by reading a selected memory cell, the method comprising:
    applying a first voltage of a positive value to a selected gate line;
    applying a voltage of 0V to non-selected gate lines;
    applying a voltage of 0V to first source lines or a first common diffusion source line and to the second source lines; and
    applying a second voltage of a positive value to a selected bit line.

5. A method of erasing the nonvolatile semiconductor memory according to claim 1 by discharging an electric charge from the charge-storage layer of all the memory cells using FN tunnel current, the method comprising:
    applying a first voltage of a positive value to bit lines and first source lines or a first common diffusion source line and to the second source lines; and
    applying a voltage of 0V to gate lines.

6. A method of erasing the nonvolatile semiconductor memory according to claim 1 by discharging an electric charge from a the charge-storage layer of a memory cell connected to a selected gate line using FN tunnel current, the method comprising:
    applying a first voltage of a positive value to bit lines and first source lines or a first common diffusion source line and to the second source lines;
    applying a voltage of 0V to the selected gate line; and
    applying a second voltage of a positive value to non-selected gate lines.

7. A method of writing to the nonvolatile semiconductor memory according to claim 2 by injecting an electric charge to the charge-storage layer of a selected memory cell using a hot electron injection, the method comprising:
    applying a first voltage of 0V or a positive value to a selected bit line;
    applying a voltage of 0V to non-selected bit lines;
    applying a second voltage of a positive value to a selected gate line;
    applying a voltage of 0V to non-selected gate lines; and applying a voltage of 0V to a first source line or a first common diffusion source line and to the second source lines.

8. A method of reading from the nonvolatile semiconductor memory according to claim 2 by reading a selected memory cell, the method comprising:
  applying a first voltage of a positive value to a selected gate line;
  applying a voltage of 0V to non-selected gate lines;
  applying a voltage of 0V to first source lines or a first common diffusion source line and to the second source lines; and
  applying a second voltage of a positive value to a selected bit line.

9. A method of erasing the nonvolatile semiconductor memory according to claim 2 by discharging an electric charge from a charge-storage layer of all memory cells using FN tunnel current comprising:
  applying a first voltage of a positive value to bit lines and first source lines or a first common diffusion source line and to the second source lines; and
  applying a voltage of 0V to gate lines.

10. A method of deleting the nonvolatile semiconductor memory according to claim 2 by discharging an electric charge from the charge-storage layer of a memory cell connected to a selected gate line using FN tunnel current, the method comprising:
  applying a first voltage of a positive value to bit lines and first source lines or a first common diffusion source line and to the second source lines;
  applying a voltage of 0V to the selected gate line; and
  applying a second voltage of a positive value to non-selected gate lines.

* * * * *